(12) United States Patent
Tamada et al.

(10) Patent No.: US 6,353,553 B1
(45) Date of Patent: Mar. 5, 2002

(54) NONVOLATILE SEMICONDUCTOR MEMORY DEVICE HAVING STRUCTURE STORING MULTIVALUED DATA AND DATA STORAGE SYSTEM COMPRISING THE NONVOLATILE SEMICONDUCTOR MEMORY DEVICE

(75) Inventors: Satoru Tamada; Tatsuya Saeki; Yasuhiro Kouro, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/615,073

(22) Filed: Jul. 12, 2000

(30) Foreign Application Priority Data

Jan. 24, 2000 (JP) .......................... 12-014557

(51) Int. Cl.[7] .............................................. G11C 16/00
(52) U.S. Cl. ............................... 365/185.03; 365/185.33
(58) Field of Search ....................... 365/185.03, 185.23, 365/185.28, 185.33, 168

(56) References Cited

U.S. PATENT DOCUMENTS 5,541,886 A * 7/1996 Hasbun ................. 365/189.04
5,574,879 A * 11/1996 Wells et al. ........... 365/185.03
5,838,610 A * 11/1998 Hashimoto ............. 365/185.03
5,966,326 A * 10/1999 Park et al. ............. 365/185.03
5,982,663 A * 11/1999 Park ...................... 365/185.03
6,046,933 A * 4/2000 Nobukata et al. ...... 365/185.03
6,067,248 A * 5/2000 Yoo ...................... 365/185.03
6,122,193 A * 9/2000 Shibata et al. ......... 365/185.03

FOREIGN PATENT DOCUMENTS

JP   11-31102    2/1999
JP   11-224491   8/1999

OTHER PUBLICATIONS

U.S. Patent Applications Serial No. 09/620,719, entitled Variable Capacity Semiconductor Storage Device, filed Jul. 20, 2000.

* cited by examiner

*Primary Examiner*—Tan T. Nguyen
(74) *Attorney, Agent, or Firm*—McDermott, Will & Emery

(57) ABSTRACT

The inventive flash memory comprises a memory cell array including nonvolatile memory cells and a control CPU controlling data writing, reading and erasing in the memory cell array and a multivalued flag part. The multivalued flag part stores a value indicating whether data written in any memory cell is binary data or multivalued data. The data can be read in a binary read sequence for the binary data or a multivalued read sequence for the multivalued data due to the value of the multivalued flag part.

17 Claims, 38 Drawing Sheets

READING OF MULTIVALUED DATA IN MULTIVALUED FLASH MEMORY

READ1

READ2

READ3

OPERATION

| DATA | | 11 | 10 | 00 | 01 |
|---|---|---|---|---|---|
| VALUE OF SENSE LATCH | READ1 | 0 | 0 | 1 | 1 |
| | READ2 | 0 | 0 | 0 | 1 |
| | READ3 | 0 | 1 | 1 | 1 |

READING OF MULTIVALUED DATA
IN FLASH MEMORY 1000

OPERATION

| STORAGE POSITION | | MF | M | M | M | M |
|---|---|---|---|---|---|---|
| DATA | | 0 | 11 | 10 | 00 | 01 |
| VALUE OF SENSE LATCH | READ1 | 0 | 0 | 0 | 1 | 1 |
| | READ2 | — | 0 | 0 | 0 | 1 |
| | READ3 | — | 0 | 1 | 1 | 1 |

READING OF BINARY DATA IN FLASH MEMORY 1000

READ1

| STORAGE POSITION | | MF | M | M | M | M |
|---|---|---|---|---|---|---|
| DATA | | 1 | 0 | 0 | 1 | 1 |
| VALUE OF SENSE LATCH | READ1 | 1 | 0 | 0 | 1 | 1 |
| | READ2 | — | — | — | — | — |
| | READ3 | — | — | — | — | — |

WRITING OF MULTIVALUED DATA
FOR MULTIVALUED FLASH MEMORY

| DATA | | 11 | 10 | 00 | 01 |
|---|---|---|---|---|---|
| VALUE OF SENSE LATCH | PROGRAM1 | 1 | 1 | 1 | 0 |
| | PROGRAM2 | 1 | 1 | 0 | 1 |
| | PROGRAM3 | 1 | 0 | 1 | 1 |

WRITING OF MULTIVALUED DATA
FOR FLASH MEMORY 1000

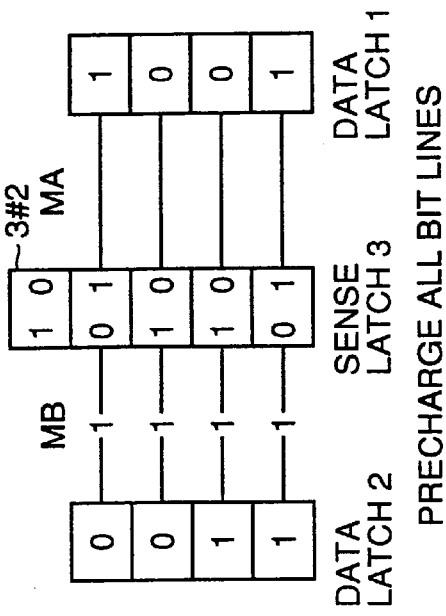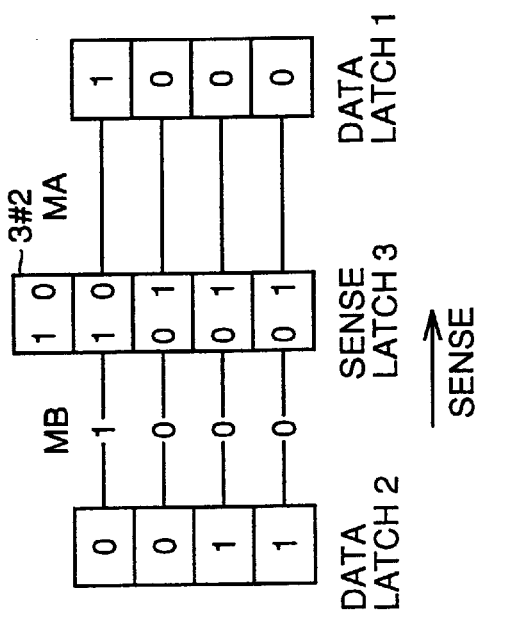
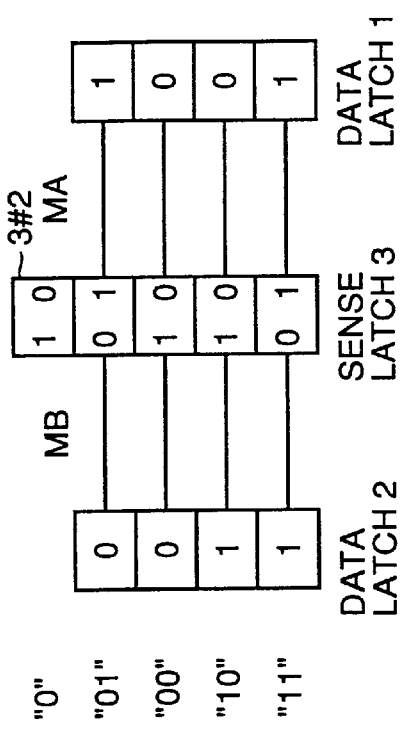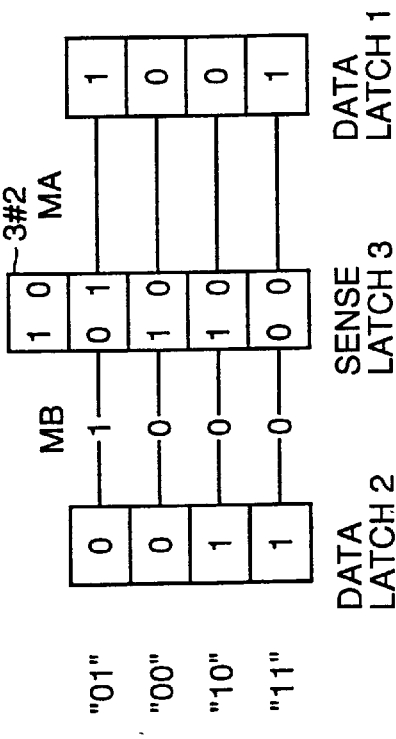

| STORAGE POSITION | MF | M | M | M | M |
|---|---|---|---|---|---|
| DATA | 0 | 11 | 10 | 00 | 01 |
| VALUE OF SENSE LATCH — PROGRAM1 | 0 | 1 | 1 | 1 | 0 |
| VALUE OF SENSE LATCH — PROGRAM2 | 1 | 1 | 1 | 0 | 1 |
| VALUE OF SENSE LATCH — PROGRAM3 | 1 | 1 | 0 | 1 | 1 |

WRITING OF BINARY DATA FOR FLASH MEMORY 1000

FIG.26
| STORAGE POSITION | MF | M | M | M | M |
|---|---|---|---|---|---|
| DATA | 1 | 1 | 1 | 0 | 0 |
| VALUE OF SENSE LATCH — PROGRAM1 | 1 | 1 | 1 | 0 | 0 |
FIG.27A
IN WRITING
(CELL SUBJECTED TO WRITING)
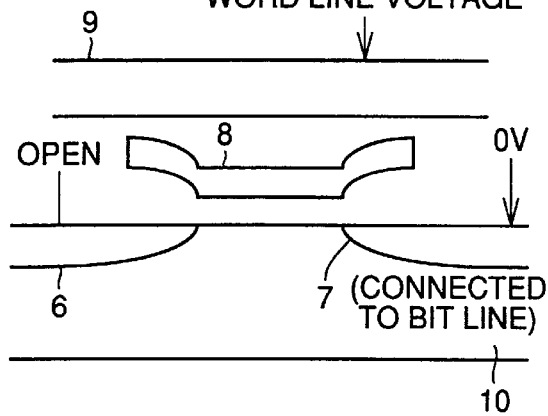
FIG.27B
IN WRITING
(CELL NOT SUBJECTED TO WRITING)
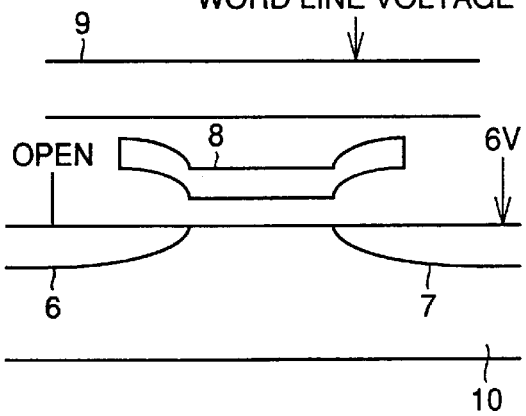
FIG.27C
IN ERASING
(BATCH ERASING PER PAGE)
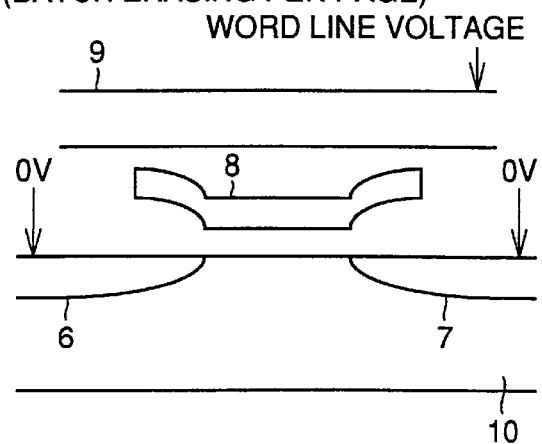
FIG.27D
IN READING
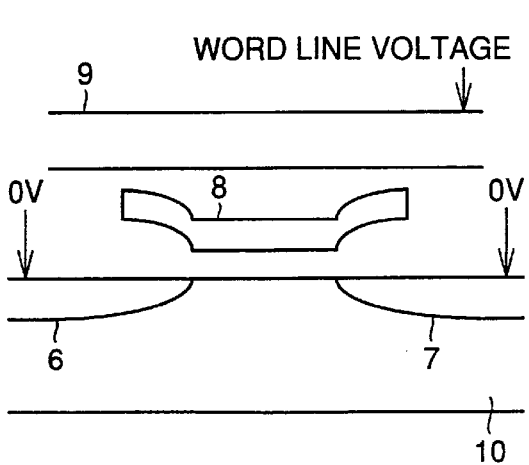

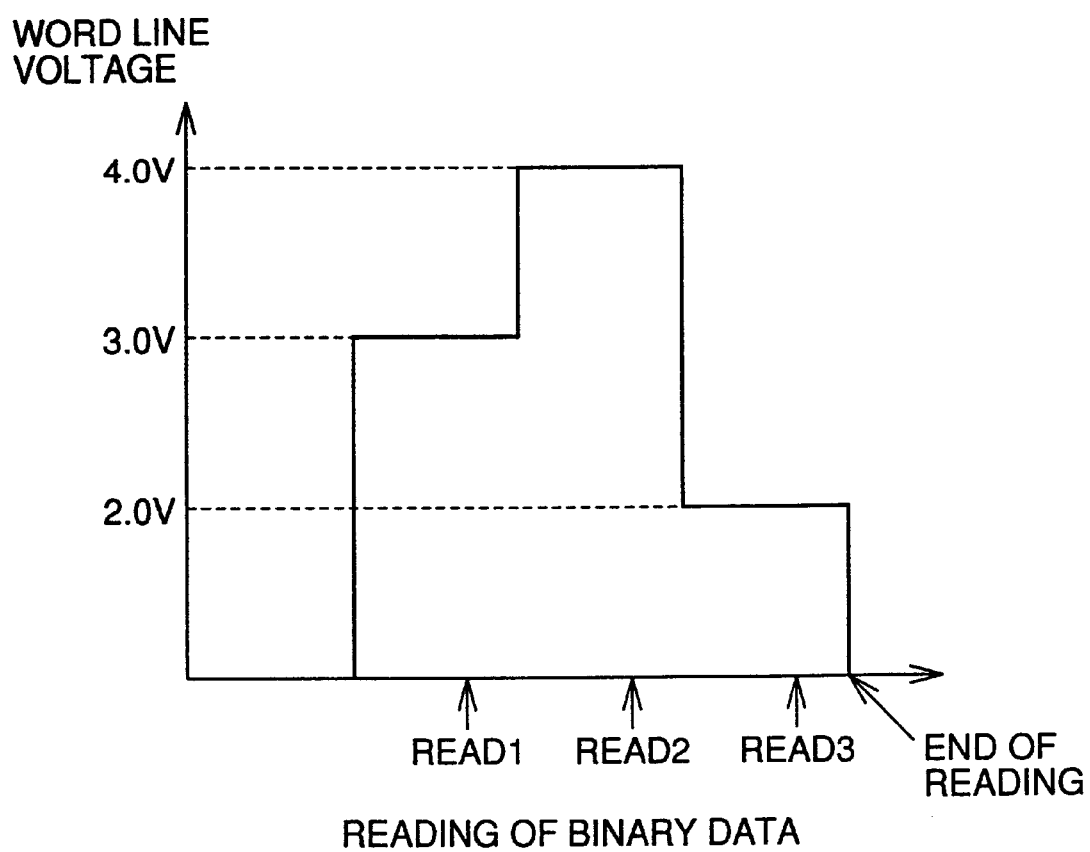

READ1

READ2

READ3

OPERATION

FIG.32

| STORAGE POSITION | | MF | M | M | M | M |
|---|---|---|---|---|---|---|
| DATA | | 0 | 1P | 1E | 0E | 0P |
| VALUE OF SENSE LATCH | READ1 | 0 | 0 | 0 | 1 | 1 |
| | READ2 | — | 0 | 0 | 0 | 1 |
| | READ3 | — | 0 | 1 | 1 | 1 |

FIG.42

| | | |
|---|---|---|
| UNUSED | | |
| USER DATA | MULTIVALUED | MULTIVALUED/BINARY FLASH MEMORY 100C |
| USER DATA | MULTIVALUED | |
| USER DATA | MULTIVALUED | |
| USER DATA | MULTIVALUED | |
| USER DATA | MULTIVALUED | |
| USER DATA IN HIGH-SPEED WRITE REQUEST | BINARY | |
| USER DATA IN HIGH-SPEED WRITE REQUEST | BINARY | |
| UNUSED | | |
| UNUSED | | |
| UNUSED | | |
| USER DATA IN HIGH-SPEED WRITE REQUEST | BINARY | MULTIVALUED/BINARY FLASH MEMORY 100B |
| USER DATA | MULTIVALUED | |
| USER DATA IN HIGH-SPEED WRITE REQUEST | BINARY | |
| USER DATA | MULTIVALUED | |
| USER DATA | MULTIVALUED | |
| UNUSED | | |
| USER DATA IN HIGH-SPEED WRITE REQUEST | BINARY | MULTIVALUED/BINARY FLASH MEMORY 100A |
| USER DATA IN HIGH-SPEED WRITE REQUEST | BINARY | |
| USER DATA | MULTIVALUED | |
| USER DATA | MULTIVALUED | |
| USER DATA | MULTIVALUED | |
| FAT INFORMATION | BINARY | |
| SOFTWARE FOR DATA STORAGE SYSTEM | BINARY | |

0000

NONVOLATILE SEMICONDUCTOR MEMORY DEVICE HAVING STRUCTURE STORING MULTIVALUED DATA AND DATA STORAGE SYSTEM COMPRISING THE NONVOLATILE SEMICONDUCTOR MEMORY DEVICE

BACKGROUND OF THE INVENTION

1. Field of the Invention

The present invention relates to a nonvolatile semiconductor memory device and a data storage system, and more particularly, it relates to a structure using electrically writable/erasable nonvolatile semiconductor memory cells.

2. Description of the Background Art

An electrically writable/erasable nonvolatile semiconductor memory (flash memory) has come into wide use as a memory for storing program codes substituting for an EPROM (Erasable Programmable Read Only Memory) or a masked ROM (Read Only Memory) with such an advantage that the same enables rewriting on a substrate.

In recent years, a mass storage flash memory capable of storing image data and sound data is developed following refinement in the semiconductor working technique, with rapid progress of application to a digital still camera or a portable audio apparatus.

In order to enable recording of motion picture data, the capacity of the flash memory must be further increased.

In addition to refinement in the semiconductor working technique, a multivalued technique can be mentioned as an important technique for implementing a larger capacity of the flash memory. The flash memory generally applies a high electric field to a floating gate isolated from the periphery by an isolation film for injecting or emitting electric charge thereby changing the threshold of a memory cell and storing data.

A general flash memory (binary flash memory) associates a high-threshold state of a memory cell with "1" (or "0") and a low-threshold state the memory cell with "0" (or "1"). Thus, a single memory cell can store one-bit data (binary data).

A flash memory (multivalued flash memory) employing the multivalued technique sets the threshold of a memory cell in at least three states. For example, a flash memory capable of storing four values sets the threshold of a memory cell in four states successively in association with "11" (the lowest threshold state), "10", "00" and "01" (the highest threshold state). Thus, a single memory cell can store two-bit data (multivalued data). Association between the -physical state of the memory cell and logical data can be arbitrarily set similarly to the case of the binary flash memory, as a matter of course.

When storing "1" (or "0") in a memory cell, leaving the memory cell intact for a long time and thereafter reading the data in implementation of such a multivalued flash memory, the data disadvantageously becomes "0" (or "1").

This problem is physically caused since electrons mainly injected into a floating gate pass through an energy barrier of an insulating film to be emitted to a semiconductor substrate or a gate or electrons are injected from the semiconductor substrate or the gate to change the threshold of the memory cell.

Referring to FIG. 44, the binary flash memory sets the threshold in the state "1" to 1 V to 1.7 V, the threshold in the state "0" to at least 4.3 V and a determination threshold in reading to 3 V, for example. In this case, each of the states "1" and "0" has a read margin of 1.3 V. In this case, false reading is caused when electrons corresponding to 1.3 V are injected/emitted.

On the other hand, the multivalued flash memory, sets the threshold in the state "11" to 1 V to 1.7 V, the threshold in the state "10" to 2.3 V to 2.7 V, the threshold in the state "00" to 3.3 V to 3.7 V and the threshold in the state "01" to at least 4.3 V, for example. When setting determination thresholds in reading to 2 V, 3 V and 4 V, each state has a read margin of only 0.3 V. Therefore, it follows that false reading is caused when electrons corresponding to 0.3 V are injected/emitted.

When a memory cell having a Vgs-Ids (Vgs: gate-source voltage, Ids: drain-source current) characteristic denoted by symbol F1 in FIG. 44 reaches the same state as a memory cell having a Vgs-Ids characteristic denoted by symbol F2 due to emission of electrons from a floating gate, written data "01" is falsely read as "00" in the multivalued flash memory.

Similarly, when a memory cell having a Vgs-Ids characteristic denoted by symbol F3 reaches the same state as a memory cell having a Vgs-Ids characteristic denoted by symbol F4, written data "11" is falsely read as "10" in the multivalued flash memory.

In the binary flash memory, data is correctly read whether a memory cell having the characteristic F1 reaches the state of a memory cell having the characteristic F2 or a memory cell having the characteristic F3 reaches the state of a memory cell having the characteristic F4.

Thus, the binary flash memory is superior in data reliability to the multivalued flash memory although the binary flash memory and the multivalued flash memory are physically equivalent in data holdability to each other. Further, the binary flash memory is superior in consideration of the data transfer rate. In consideration of the cost and the storage capacity, however, the multivalued flash memory is superior as described above. For future benefit, therefore, development of a device effectively implementing all these characteristics is demanded.

SUMMARY OF THE INVENTION

Accordingly, an object of the present invention is to provide a nonvolatile semiconductor memory device and a data storage system implementing a large storage capacity, improving reliability of data and enabling a high-speed operation.

A nonvolatile semiconductor memory device according to an aspect of the present invention includes a nonvolatile memory cell array including a plurality of memory cells and a control circuit for controlling a write operation, a read operation and an erase operation for the plurality of memory cells, and the control circuit writes binary data or multivalued data in a memory cell subjected to writing in response to a write request and reads the binary data or the multivalued data in response to the contents written in a memory cell subjected to reading in the read operation.

Preferably, the control circuit sets the memory cell subjected to writing in either a first state for erasing or an n-th state different from the first state when writing the binary data while setting the memory cell in any of n (at least three) different states in total ranging from the first state to the n-th state when writing the multivalued data. Further, the control circuit determines to which one of states ranging from the first state to a k-th state, where n is greater than k, or ranging from a (k+1)-th state to the n-th state the memory cell storing the binary data belongs while determining to which one of the n states in total the memory cell storing the multivalued data belongs in the read operation.

In particular, the control circuit determines to which one of the n states in total the memory cell storing the binary data belongs in the read operation and outputs a warning signal indicating change of the binary data when determining that the memory cell belongs to a state different from the first state or the n-th state. Alternatively, the control circuit determines to which one of the n states in total the memory cell storing the binary data belongs in the read operation and performs a write operation for rewriting the binary data in the memory cell when determining that the memory cell belongs to a state different from the first state or the n-th state.

According to the aforementioned nonvolatile semiconductor memory device, the binary data or the multivalued data of at least three values can be written or read in response to a request. Thus, data can be written and read at a high speed with high reliability at need while storing data of a large volume.

According to the aforementioned nonvolatile semiconductor memory device, further, displacement of the threshold can be detected with respect to the memory cell storing the binary data.

According to the aforementioned nonvolatile semiconductor memory device, the binary data can be rewritten (repaired) in the memory cell storing the binary data when detecting displacement of the threshold.

Preferably, the plurality of memory cells are divided into a plurality of write/read units collectively subjected to the write operation and the read operation, the nonvolatile semiconductor memory device further comprises a plurality of flags arranged for the plurality of write/read units respectively, and each of the plurality of flags stores a value indicating whether the binary data is written or the multivalued data is written in the memory cell of the corresponding write/read unit.

In particular, the control circuit writes the binary data or the multivalued data in the write/read unit subjected to writing while writing a value indicating whether the binary data is written or the multivalued data is written in the corresponding flag in the write operation.

In particular, the control circuit executes a first write sequence for writing the binary data or a second write sequence for writing the multivalued data for the write/read unit subjected to writing in response to the externally received write request. The control circuit executes a first read sequence for reading the binary data when the binary data is written in the write/read unit subjected to reading while executing a second read sequence for reading the multivalued data when the multivalued data is written in the write/read unit subjected to reading on the basis of the value of the corresponding flag subjected to reading in the read operation.

According to the aforementioned nonvolatile semiconductor memory device, the flag is arranged for each write/read unit (sector or page). Thus, the value indicating whether the binary data is written or the multivalued data is written can be stored in the flag.

According to the aforementioned nonvolatile semiconductor memory device, the flag is identical in structure to the memory cell, whereby writing/reading in/from the flag can be readily performed simultaneously with writing/reading in/from the memory cell.

According to the aforementioned nonvolatile semiconductor memory device, the flag can store whether the binary data is written or the multivalued data is written in the memory cell simultaneously with writing in the memory cell.

According to the aforementioned semiconductor memory device, the write sequence for the binary data can be executed when a write request for the binary data is externally received while the write sequence for the multivalued data can be executed when a write request for the multivalued data is externally received.

According to the aforementioned nonvolatile semiconductor memory device, the binary data or the multivalued data can be read from each write/read unit on the basis of the flag.

Preferably, each of the plurality of memory cells has different n states in total, where n is at least three, including a first state for erasing and a second state closest to the first state, and the control circuit sets the memory cell subjected to writing in the first state or in the second state when writing the binary data and determines whether the memory cell subjected to reading belongs to the first state or any of the n states in total excluding the first state when reading the binary data.

The aforementioned nonvolatile semiconductor memory device controls the memory cell subjected to writing to enter the first state or the second state in response to the write request and determines whether the memory cell subjected to reading is in the first state or in another state in the read operation. Thus, the binary data can be written/read.

A data storage system according to another aspect of the present invention includes memory area including a first nonvolatile semiconductor memory having a first characteristic and a second nonvolatile semiconductor memory having a second characteristic different from the first characteristic and a control unit transmitting/receiving data to/from an external device for writing data in the memory area and reading data from the memory area, while the control unit determines whether writing matching with the first characteristic is required or writing matching with the second characteristic is required in response to storage data received from the external device to be written in the memory area and writes the storage data in the first nonvolatile semiconductor memory or the second nonvolatile semiconductor memory in response to the determination.

Preferably, the first characteristic is a characteristic capable of storing data with prescribed reliability and operating at a prescribed processing speed, and the second characteristic is a characteristic capable of storing data with relatively higher reliability than the first characteristic and operating at a higher speed than the first characteristic.

The aforementioned data storage system comprises at least two nonvolatile semiconductor memories having different characteristics and can store data in the nonvolatile semiconductor memory having a corresponding characteristic in response to the storage data. In particular, highly reliable data processing can be executed at a high speed with a large capacity by employing the first nonvolatile semiconductor memory capable of storing data with the prescribed reliability and operating at the prescribed processing speed and the second nonvolatile semiconductor memory device capable of storing data with the relatively higher reliability than the first nonvolatile semiconductor memory and operating at the higher speed than the first characteristic.

Preferably, the first nonvolatile semiconductor memory includes a plurality of multivalued data memory cells each storing data of at least two bits, and the second nonvolatile semiconductor memory includes a plurality of memory cells each storing data of one bit.

Preferably, the control unit writes the storage data in the second nonvolatile semiconductor memory when determining that the external device requires an operation of writing data requiring relatively high reliability or transmitting/receiving data at a high speed while otherwise writing the storage data in the first nonvolatile semiconductor memory in response to the storage data.

Preferably, the control unit writes the storage data in the second nonvolatile semiconductor memory when the first nonvolatile semiconductor memory is in operation while writing the storage data in the first nonvolatile semiconductor memory when the first nonvolatile semiconductor memory is not in operation.

Preferably, the control unit transfers data already written in the second nonvolatile semiconductor memory to the first nonvolatile semiconductor memory in response to absence of data transmission/receiving to/from the external device.

Preferably, the control unit writes management data for managing the memory area in the second nonvolatile semiconductor memory.

According to the aforementioned data storage system, the second nonvolatile semiconductor memory storing the binary data and the first nonvolatile semiconductor memory storing the multivalued data can be employed.

According to the aforementioned data storage system, the data can be written in the nonvolatile semiconductor memory corresponding to the binary data when determining that the external device requires the operation of writing data requiring relatively high reliability or transmitting/receiving data at a high speed.

According to the aforementioned data storage system, the storage data can be written in the second nonvolatile semiconductor memory when the first nonvolatile semiconductor memory is in operation or the storage data can be written in the first nonvolatile semiconductor memory when the first nonvolatile semiconductor memory is not in operation.

According to the aforementioned data storage system, the binary data written in the nonvolatile semiconductor memory corresponding to the binary data can be stored in the nonvolatile semiconductor memory corresponding to the multivalued data in response to absence of data a transmission/receiving to/from the external device.

According to the aforementioned data storage system, the management data for managing the memory area is stored as binary data in the nonvolatile semiconductor memory corresponding to the binary data. Thus, the probability of false reading related to the management data is reduced, thereby reducing a possibility of causing a critical error in the system.

A data storage system according to still another aspect of the present invention includes a nonvolatile memory area including a plurality of memory cells each of which is capable of storing data in a binary state or a multivalued state of at least three values and reading the stored data of the binary state or the multivalued state and a control unit transmitting/receiving data to/from an external device for writing data in the nonvolatile memory area and reading data from the nonvolatile memory area, and the control unit writes storage data in the nonvolatile memory area in the binary state when determining that the external device requires an operation of writing data requiring relatively high reliability or transmitting/receiving data at a high speed in response to the storage data.

In particular, the control unit writes management data for managing the nonvolatile memory area in the nonvolatile memory area in the binary state.

The aforementioned data storage system includes the plurality of memory cells capable of storing data in the binary state or in the multivalued state, and can store data in the binary state or in the multivalued state in response to data received from the external device. Thus, highly reliable data processing can be executed at a high speed in a large capacity.

The aforementioned data storage system stores the management data for managing the memory area in the binary state. Thus, the probability of false reading related to the management data is reduced for reducing the possibility of causing a critical error in the system.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 22A to 22D illustrate a write sequence (PROGRAM1) for multivalued data in the flash memory 1000;

FIG. 26 illustrates the relation between data and values of the sense latches in the binary data write operation of the flash memory 1000;

FIGS. 27A to 27D are diagrams for illustrating the voltage relation in writing, erasing and reading operations of the flash memory 1000;

FIG. 28 illustrates word line voltages in binary data reading of a flash memory according to a second embodiment of the present invention;

FIG. 32 illustrates the relation between data and values of sense latches in a binary data read operation;

FIG. 42 illustrates exemplary data arrangement on an address space in the data storage system 5000;

DESCRIPTION OF THE PREFERRED EMBODIMENTS

Figure 1:
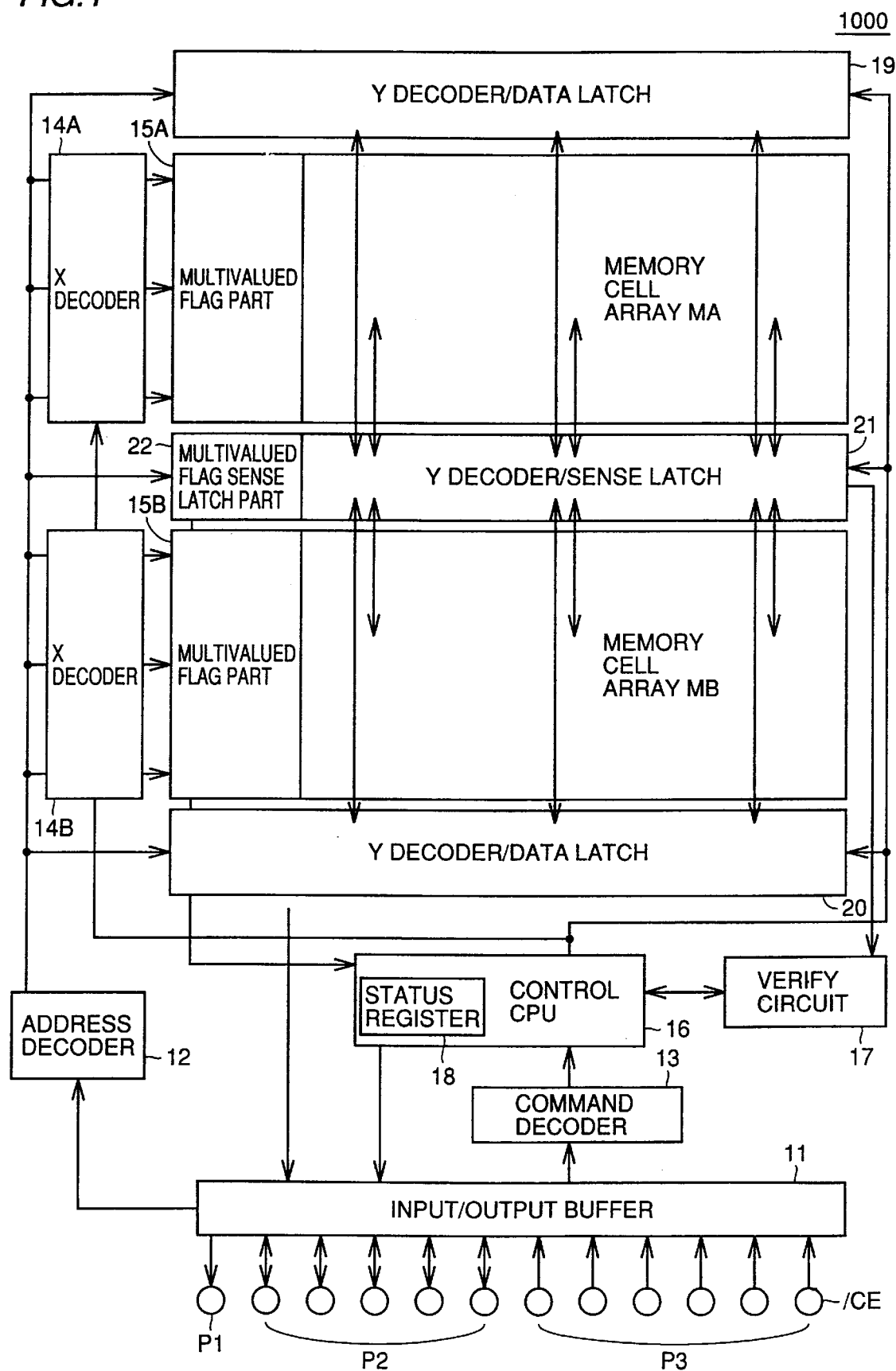
FIG. 1 is a block diagram showing an outline of the overall structure of a flash memory 1000 according to a first embodiment of the present invention.

Embodiments of the present invention are now described in detail with reference to the drawings. Referring to the drawings, parts identical or corresponding to each other are denoted by the same reference numerals and redundant description is not repeated.

[First Embodiment]

A flash memory 1000 according to a first embodiment of the present invention is now described. The first embodiment of the present invention relates to the flash memory 1000 capable of combining an area storing multivalued data and an area storing binary data with each other.

Referring to FIG. 1, the flash memory 1000 comprises a plurality of pins for transmitting/receiving signals to/from an external device, an input/output buffer 11 provided in correspondence to the plurality of pins, an address decoder 12 decoding an internal address signal output from the input/output buffer 11, a command decoder 13 decoding an internal control signal output from the input/output buffer 11 and issuing a command, and memory cell arrays MA and MB each including a plurality of nonvolatile memory cells arranged in rows and columns.

The plurality of pins include a pin P1 (R/B pin P1) outputting a signal R/B (R/B: ready/busy) indicating whether the memory 1000 is in operation (busy state) or operable (ready state), a data input/output pin group P2 inputting/outputting data and a control pin group P3 receiving external control signals controlling internal operations. The control pin group P3 includes a pin /CE receiving a chip enable signal /CE.

Figure 44:
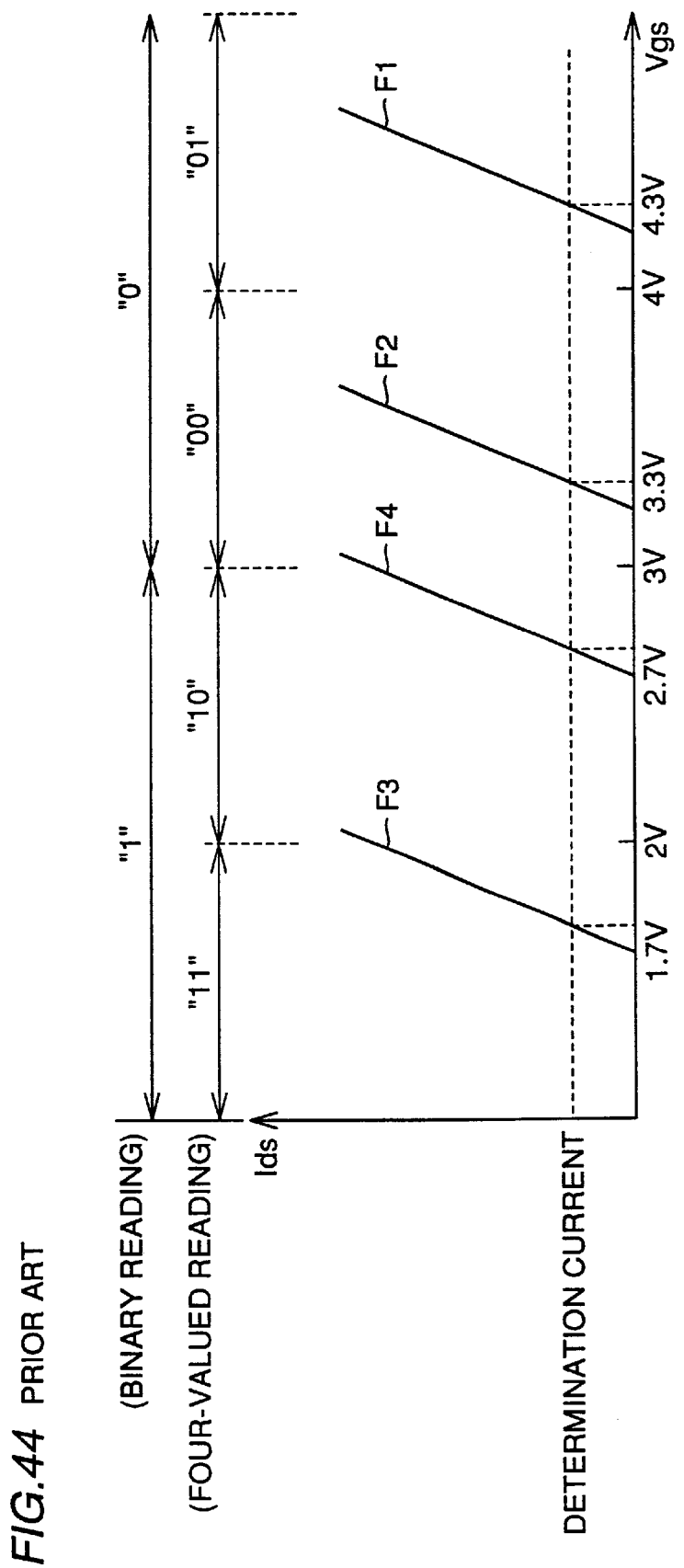
FIG. 44 illustrates the relation between multivalued data and binary data in nonvolatile memory cells.

Each of the memory cells included in the memory cell arrays MA and MB is settable in a plurality of states, and stores binary (one-bit) data or multivalued (at least two-bit) data. The following description is made with reference to exemplary multivalued data "01", "00", "10" and "11". The association shown in FIG. 44 is applied as to the relation between the multivalued data/binary data and thresholds. According to the first embodiment, the memory cell is set in the state of the multivalued data "01" when a write request for binary data "0" is received.

The flash memory 1000 further comprises a control CPU (Central Processing Unit) 16 for controlling data writing, reading, erasing etc. and a verify circuit 17 for controlling a verify operation. The control CPU 16 includes a status register 18 holding the internal status of the device. Information held in the status register 18 can be output.

An externally received command controls whether data is stored in the memory cell in a binary state or in a multivalued state. The command decoder 13 recognizes whether a binary write command is input or a multivalued write command is input. The control CPU 16 makes control for writing data in the memory cell along a binary write sequence or a multivalued write sequence in response to output from the command decoder 13.

Reading/writing is performed on a sector (or a page) formed by memory cells connected to a single word line as a unit.

The flash memory 1000 further comprises an X decoder 14A receiving the output of the address decoder 12 and performing row-directional selection in the memory cell array MA, another X decoder 14B receiving the output of the address decoder 12 and performing row-directional selection in the memory cell array MB, a multivalued flag part 15A provided for the memory cell array MA, another multivalued flag part 15B provided for the memory cell array MB, Y decoders/data latches 19 and 20 operating in response to the output of the address decoder 12 and that of the control CPU 16, a Y decoder/sense latch 21 operating in response to the output of the address decoder 12 and that of the control CPU 16 and a multivalued flag sense latch part 22. The Y decoders perform column-directional selection in the memory cell arrays MA and MB.

The multivalued flag parts 15A and 15B store values indicating whether binary data are stored or multivalued data are stored in the memory cells, as described later. The control CPU 16 controls data writing ("0" in the multivalued state or "1" in the binary state) in the multivalued flag parts 15A and 15B and data reading from the multivalued flag part 15A and 15B. The data are read from the multivalued flag parts 15A and 15B in the same procedure as data reading from the memory cells, as described later.

Figure 2:
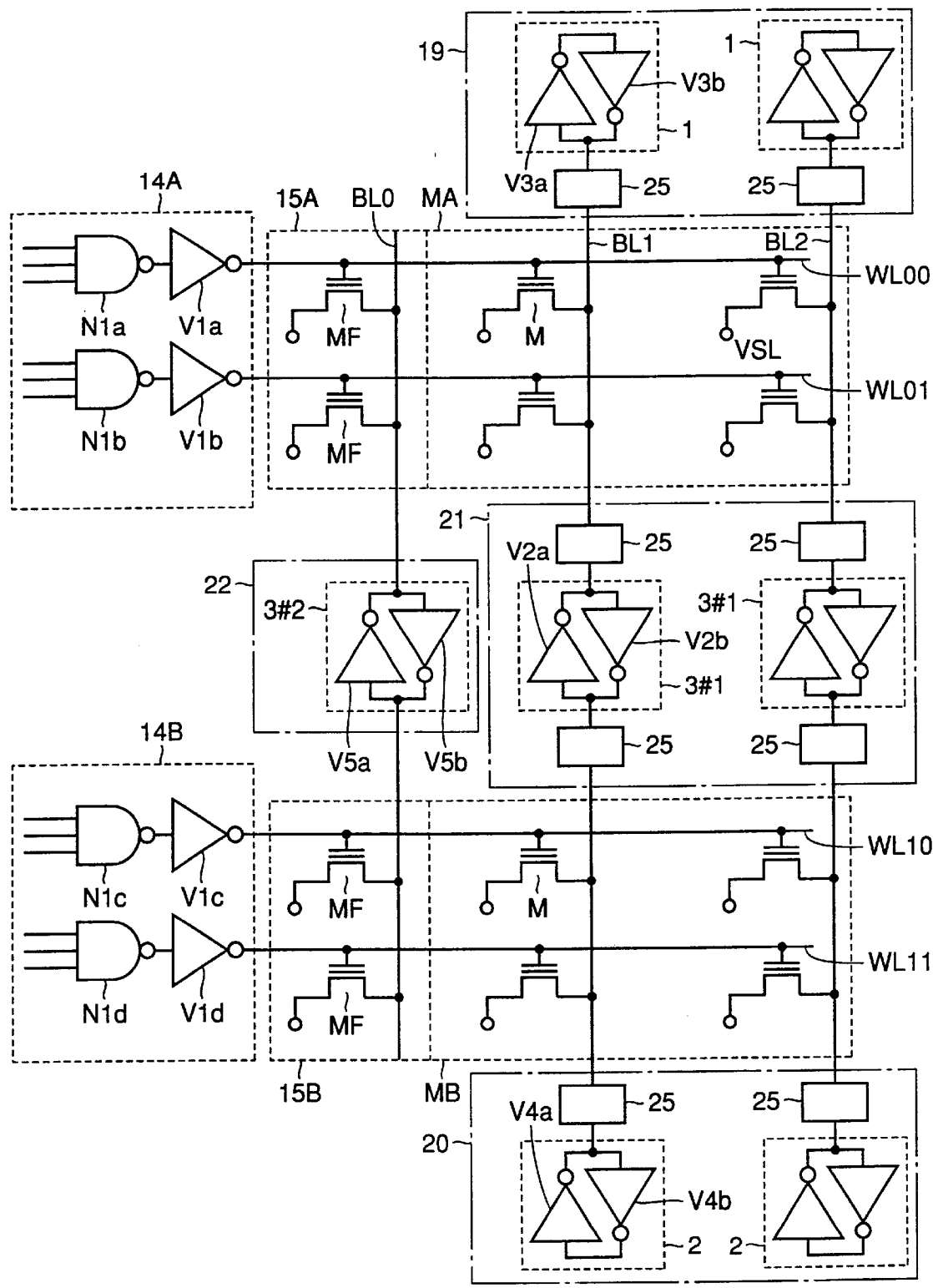
FIG. 2 is a circuit diagram showing the structure of a principal part of the flash memory 1000.

Referring to FIG. 2, the memory cell array MA includes a plurality of nonvolatile memory cells M and word lines WL00 and WL01 arranged in the row direction. The memory cell array MB also includes a plurality of nonvolatile memory cells M and word lines WL10 and WL11 arranged in the row direction. Bit lines BL1 and BL2 are arranged in common in correspondence to the columns of the memory cell arrays MA and MB.

Each memory cell M has a control gate layer connected to any word line, a drain region connected to either bit line and a source region receiving a source voltage VSL.

Each of the X decoders 14A and 14B includes a plurality of NAND circuits receiving a decode signal output from the address decoder 12 and a plurality of inverters. The X decoder 14A includes an inverter V1a inverting the output of a NAND circuit N1a and driving the word line WL00 and an inverter V1b inverting the output of a NAND circuit N1b and driving the word line WL01. The X decoder 14B includes an inverter V1 inverting the output of a NAND circuit N1c and driving the word line WL10 and an inverter V1d inverting the output of a NAND circuit N1d and driving the word line WL11.

Each of the multivalued flag parts 15A and 15B includes multivalued flags MF. The multivalued flags MF are identical in structure to the memory cells M (nonvolatile memory cells). FIG. 2 shows four multivalued flags MF connected to the word lines WL00, WL01, WL10 and WL11 respectively. The multivalued flags MF are arranged in units of sectors or pages. A line (referred to as a bit line BL0) arranged in the bit line direction connects the multivalued flags MF with the multivalued flag sense latch part 22. Each multivalued flag MF stores a value indicating whether data is written in the memory cells M connected to the same word line in the binary state or in the multivalued state.

The Y decoder/sense latch 21 includes sense latches 3#1 provided in correspondence to the bit lines BL1 and BL2. Each sense latch 3#1 is formed by inverters V2a and V2b.

The Y decoder/data latch 19 includes data latches 1 arranged in correspondence to the bit lines BL1 and BL2. Each data latch 1 is formed by inverters V3a and V3b. The Y decoder/data latch 20 includes data latches 2 arranged in correspondence to the bit lines BL1 and BL2. Each data latch 2 is formed by inverters V4a and V4b.

The respective drains of the memory cells M connected to a single word line are electrically connected to different sense latches and different data latches.

In a read operation, a read voltage is supplied to the word lines for determining whether or not current flows in the memory cells through the sense latches. The data latches 1 and 2 are used for saving read results. According to the first embodiment of the present invention, the data latches 1 and 2 are arranged for reading a signal of two bits from a single memory cell. The data is output with the values of the data latches 1 and 2.

In a write operation, data are first input in the data latches 1 and 2 and then values are set in the sense latches 3#1, for changing the thresholds of the memory cells.

The multivalued flag sense latch part 22 includes a sense latch 3#2 formed by inverters V5a and V5b. The sense latches 3#1 and 3#2 are generically referred to as sense latches 3.

A signal processing circuit 25 is arranged between each latch (data or sense latch) and each bit line.

Figure 3:
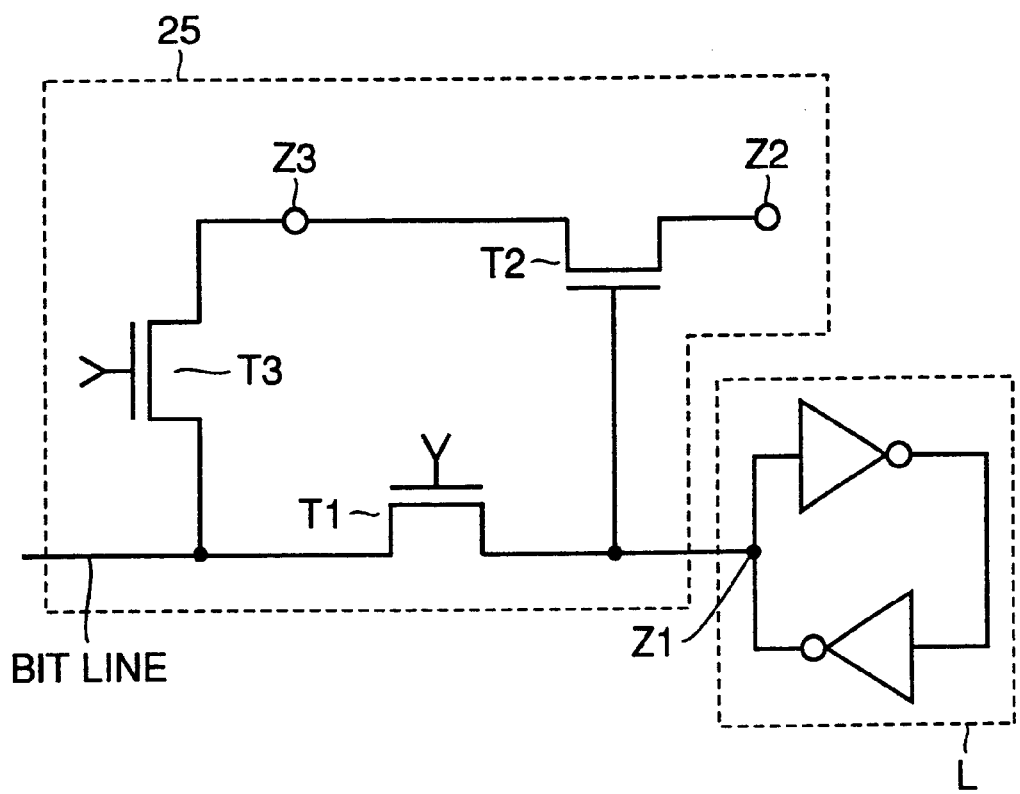
FIG. 3 is a circuit diagram for illustrating the structure of a signal processing circuit 25.

As shown in FIG. 3, the signal processing circuit 25 includes NMOS transistors T1, T2 and T3. Referring to FIG. 3, symbol L denotes either the data latch or the sense latch.

The transistor T1 is arranged between the bit line and an input/output node Z1 of the latch L. The transistor T2 is connected between nodes Z2 and Z3, and the gate thereof is connected with a node Z1. The transistor T3 is connected between the node Z3 and the bit line.

The signal processing circuit 25 controls selective precharging, selective discharging and sensing. The control CPU 16 supplies signals to the node Z2 and the gates of the transistors T1 and T3 in response to the processing.

Figure 4A:
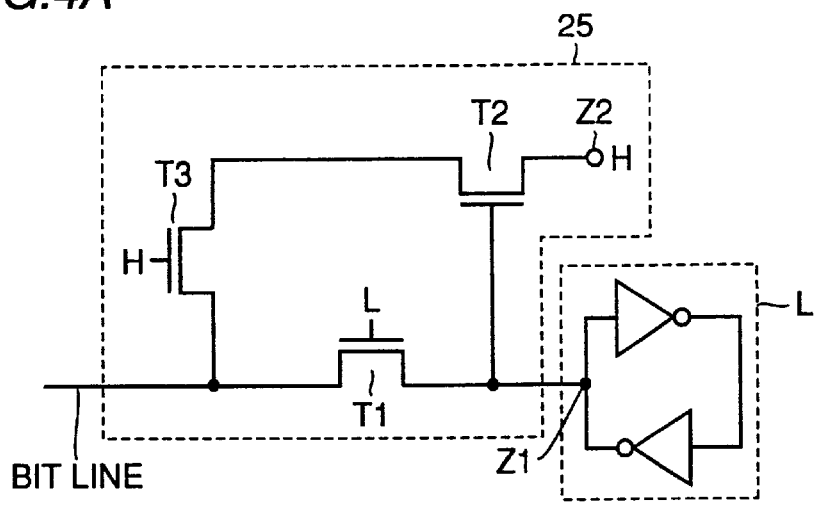
FIGS. 4A to 4C illustrate states of signals in selective precharging, selective discharging and sensing.

In selective precharging, the control CPU 16 applies a low-level signal to the gate of the transistor T1, a high-level signal to the node Z2 and a high-level signal to the gate of the transistor T3, as shown in FIG. 4A. The transistors T2 and T3 set the bit line high when the latch L latches "1", while the bit line holds the voltage level thereof as such when the latch L latches "0".

Figure 4B:
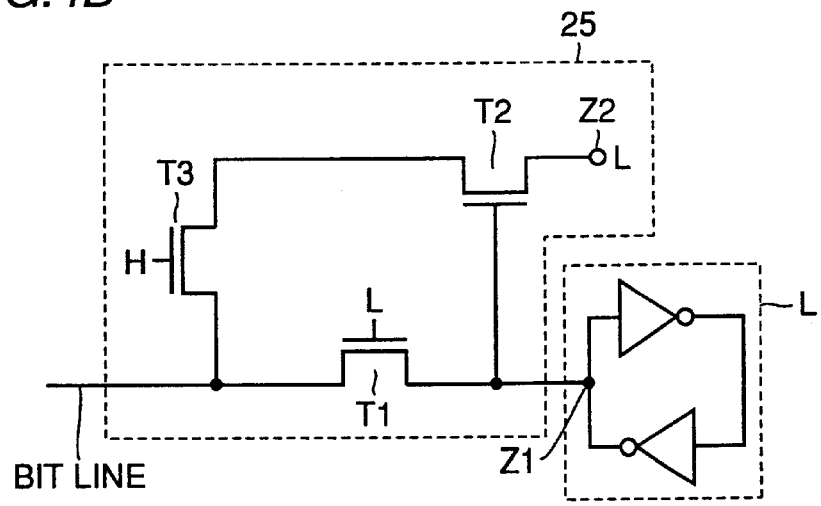

In selective discharging, the control CPU 16 applies a low-level signal to the gate of the transistor T1, a low-level signal to the node Z2 and a high-level signal to the gate of the transistor T3, as shown in FIG. 4B. The bit line is set high when the latch L latches "1", while the bit line holds the voltage level thereof as such when the latch L latches "0".

Figure 4C:
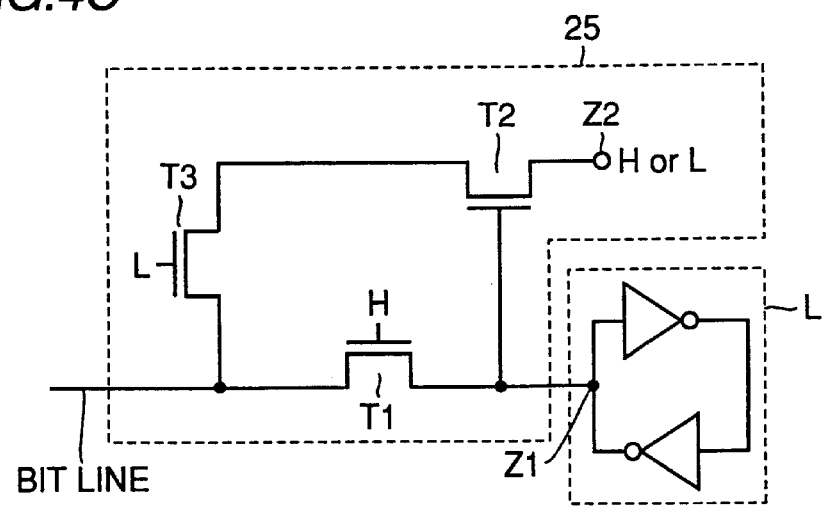

In sensing, the control CPU 16 applies a high-level signal to the gate of the transistor T1, a high- or low-level signal to the node Z2 and a low-level signal to the gate of the transistor T3, as shown in FIG. 4C. The value of the latch L reaches "1" or "0" in response to the potential of the bit line.

Latch-to-latch data transfer described below is implemented by performing selective precharging on the basis of the transferring latch and performing sensing in the destination latch.

Outlines of writing, reading and erasing in the flash memory 1000 are described with reference to FIGS. 27A to 27D. Each memory cell M includes a source region 6, a drain region 7 connected to a bit line, a floating gate layer 8 and a control gate layer 9 connected with a word line, which are formed on a substrate 10.

In data writing, a positive high voltage (18 V, for example) is. applied to the control gate layer 9 of a memory cell M subjected to writing through the word line, as shown in FIG. 27A. At this time, the corresponding sense latch is set to "0" (0 V) for applying 0 V to the drain region 7. The source region 6 is brought into an open state.

As to a memory cell M not subjected to writing, the corresponding sense latch is set to "1" (6 V) for applying 6 V to the drain region 7, as shown in FIG. 27B.

In collective erasing of data, a negative high voltage (−16 V, for example) is applied to the control gate layer 9, as shown in FIG. 27C. At this time, 0 V is applied to the source region 6 and the drain region 7. The threshold of the memory cell M reaches the lowest level (corresponding to multivalued data "11" or binary data "1").

In data reading, a positive voltage (3 V, for example) is applied to the control gate layer 9 through the word line and 0 V is applied to the source region 6 and the drain region 7, as shown in FIG. 27D. The sense latch determines whether or not current flows in the memory cell M.

A data read sequence in the flash memory 1000 is now described in detail in comparison with a multivalued flash memory storing only multivalued data.

The multivalued flash memory executes a read sequence shown in FIGS. 5, 6A to 6C, 7A and 7B. It is assumed that the multivalued flash memory reads multivalued data ("01", "00", "10" and "11") with data latches 1 and 2 and sense latches 3 similarly to the flash memory 1000.

Figure 5:
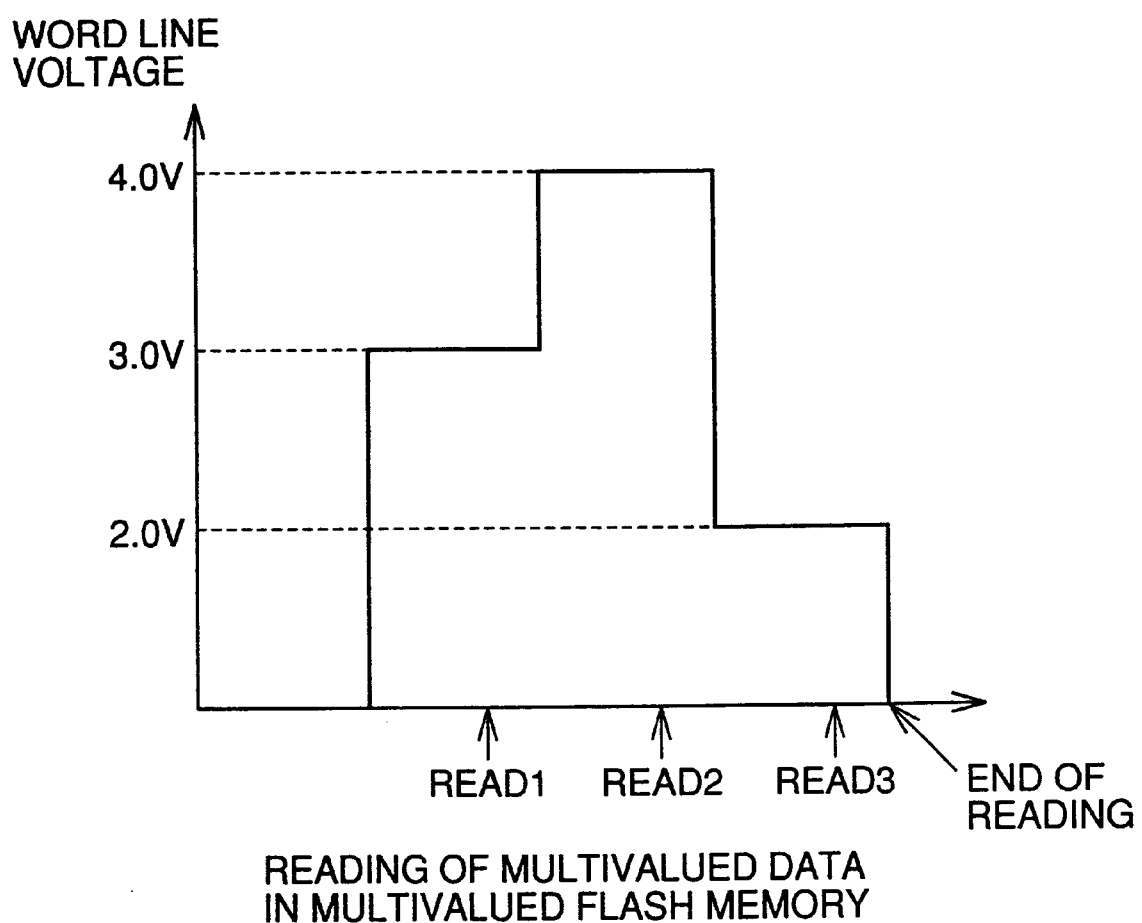
FIG. 5 illustrates word line voltages in a read operation of a multivalued flash memory.
Figure 6A:
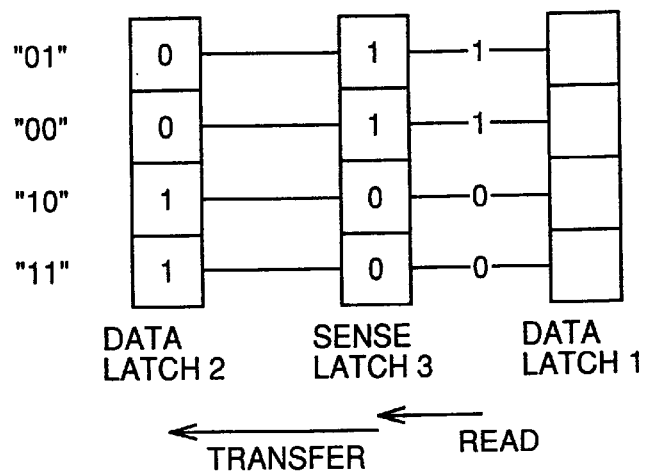
FIGS. 6A to 6C illustrate a read sequence (READ1 to READ3) in the multivalued flash memory.
Figure 6B:
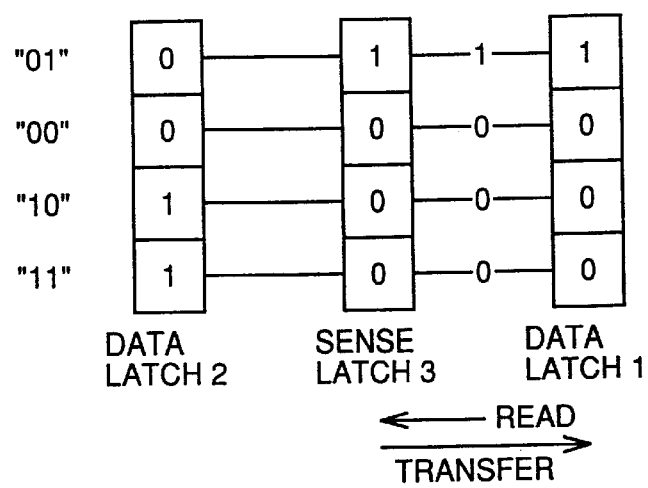
Figure 6C:
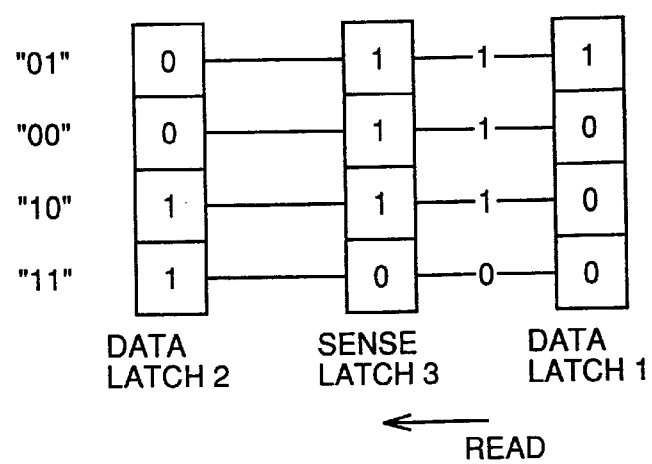

Referring to FIG. 5, the multivalued flash memory executes three read operations READ1, READ2 and READ3. The word line voltage is set to 3.0 V in the read operation READ1, to 4.0 V in the read operation READ2, and to 2.0 V in the read operation READ3.

In the read operation READ1 (see FIG. 6A), the multivalued flash memory reads data from a memory cell array and latches the read data ("1", "1", "0", "0") in the sense latches 3. Then, the sense latches 3 transfer the data to the data latches 2 (transfer).

In the read operation READ2 (see FIG. 6B), the multivalued flash memory reads data from the memory cell array and latches the read data ("1", "0", "0", "0") in the sense latches 3. Then, the sense latches 3 transfer the data to the data latches 1 (transfer).

In the read operation READ3 (see FIG. 6C), the multivalued flash memory reads data from the memory cell array and latches the read data ("1", "1", "1", "0") in the sense latches 3.

Figure 7A:
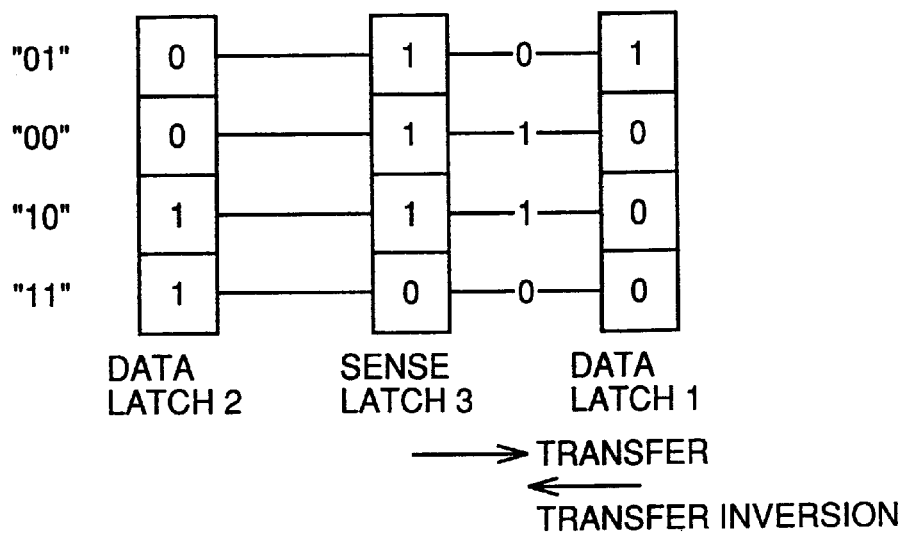
FIGS. 7A and 7B illustrate a read sequence in the multivalued flash memory.

Then, the multivalued flash memory performs operation processing (see FIG. 7A). In the operation processing, the sense latches 3 transfer the data to the data latches 1 (transfer), and the data latches 1 transfer the data to the sense latches 3 (transfer inversion). Thus, the data of the sense latches 3 and the data of the data latches 1 are subjected to XOR processing.

Figure 7B:
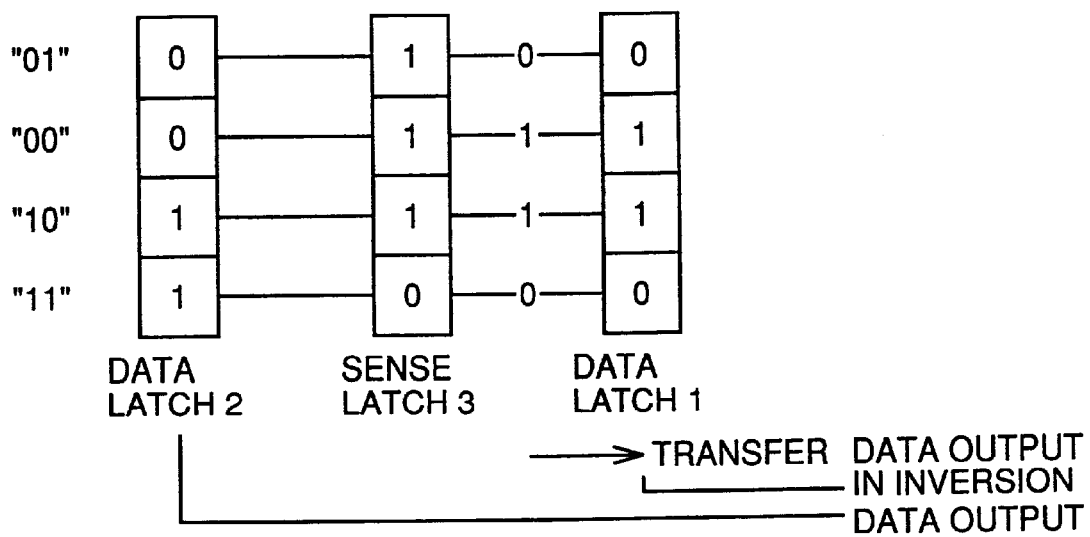

Then, the multivalued flash memory performs output processing (see FIG. 7B). More specifically, the sense latches 3 transfer the data to the data latches 1 (transfer). The multivalued flash memory outputs the data ("0", "0", "1", "1") of the data latches 2 and data obtained by inverting the data ("0", "1", "1", "0") of the data latches 1. Thus, it follows that the multivalued flash memory reads the multivalued data ("01", "00", "10", "11").

Figures 8, 9:
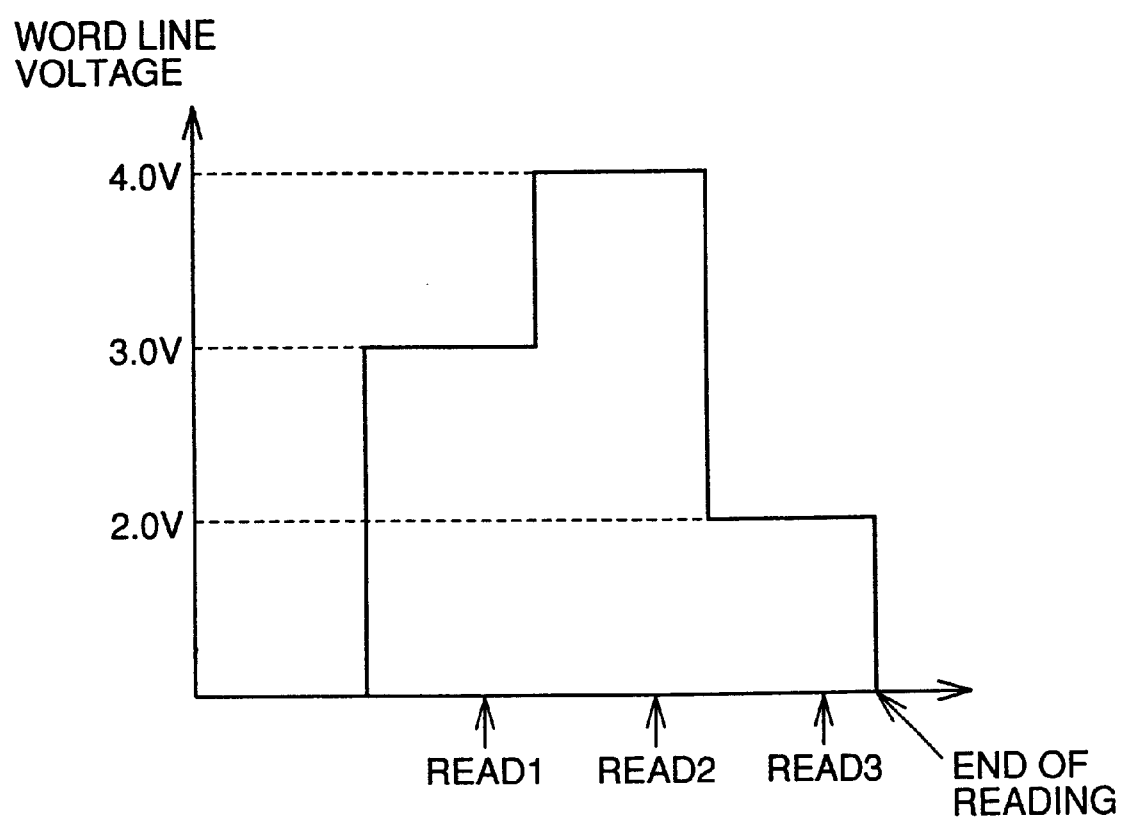
FIG. 8 illustrates the relation between data and values of sense latches in the read operation of the multivalued flash memory.
FIG. 9 illustrates word line voltages in a multivalued data read operation of the flash memory 1000.
Figure 10A:
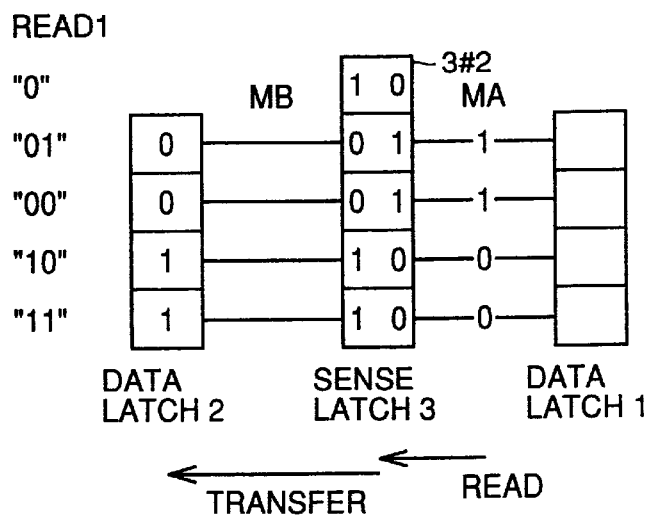
FIGS. 10A to 10C illustrate a read sequence (READ1 to READ3) for multivalued data in the flash memory 1000.
Figure 10B:
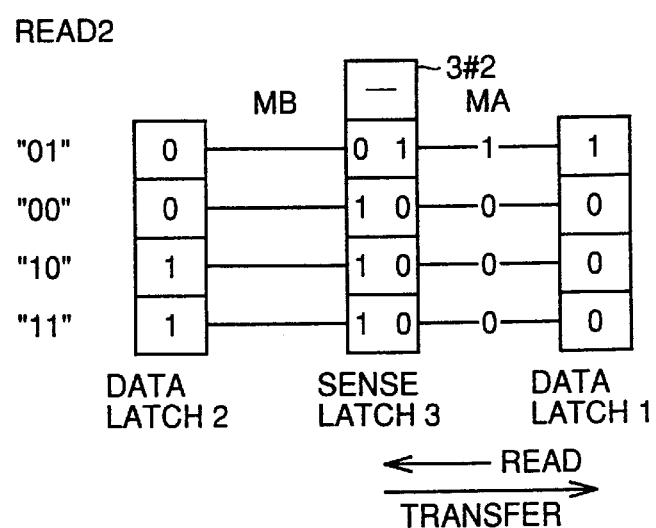
Figure 10C:
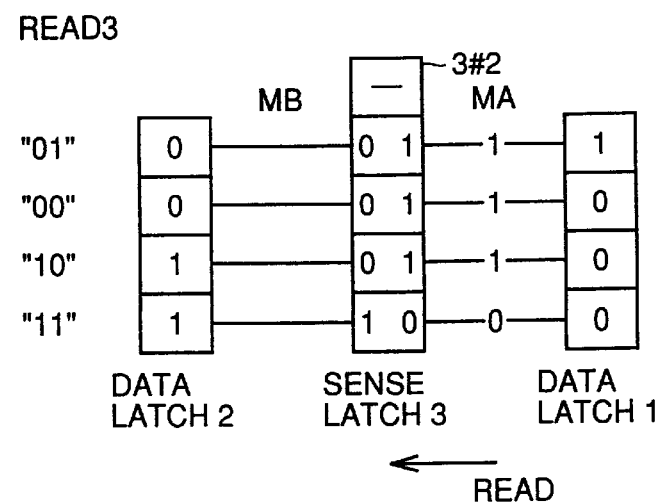

FIG. 8 shows the relation between the data (values of the data latches after the three read operations) and values latched in the sense latches 3 in the respective operations.

On the other hand, the flash memory 1000 executes a read sequence for multivalued data shown in FIGS. 9 to 11B. First, the control CPU 16 reads data of the multivalued flag MF in a first read operation READ1 and determines whether or not to perform second and third read operations READ2 and READ3 on the basis of the value. When the data of the multivalued flag MF is "0", i.e., indicates that the memory cells M of the same sector (or the same page) store multivalued data, the control CPU 16 executes the second and third read operations READ2 and READ3. The word line voltage is set to 3.0 V in the read operation READ1, to 4.0 V in the read operation READ2 and to 2.0 V in the read operation READ3.

In the read operation READ1 (see FIG. 10A), the control CPU 16 reads data of any memory cells M of the memory cell array MA and data of the multivalued flag MF corresponding to these memory cells M. The sense latches 3#1 latch the data ("1", "1", "0", "0") of the memory cells M and the sense latch 3#2 latches the data ("0") of the multivalued flag MF.

The data of the multivalued flag MF is "0" and hence the control CPU 16 executes the read sequence for multivalued data. The sense latches 3#1 transfer the data of the memory cells M to the data latches 1 (transfer).

In the read operation READ2 (see FIG. 10B), the control CPU 16 reads data from the memory cells M. The sense latches 3#1 latch the data ("1", "0", "0", "0") of the memory cells M. The sense latches 3#1 transfer the data of the memory cells M to the data latches 1 (transfer).

In the read operation READ3 (see FIG. 10C), the control CPU 16 reads data from the memory cells M. The sense latches 3#1 latch the data ("1", "1", "1", "0") of the memory cells M.

Figure 11A:
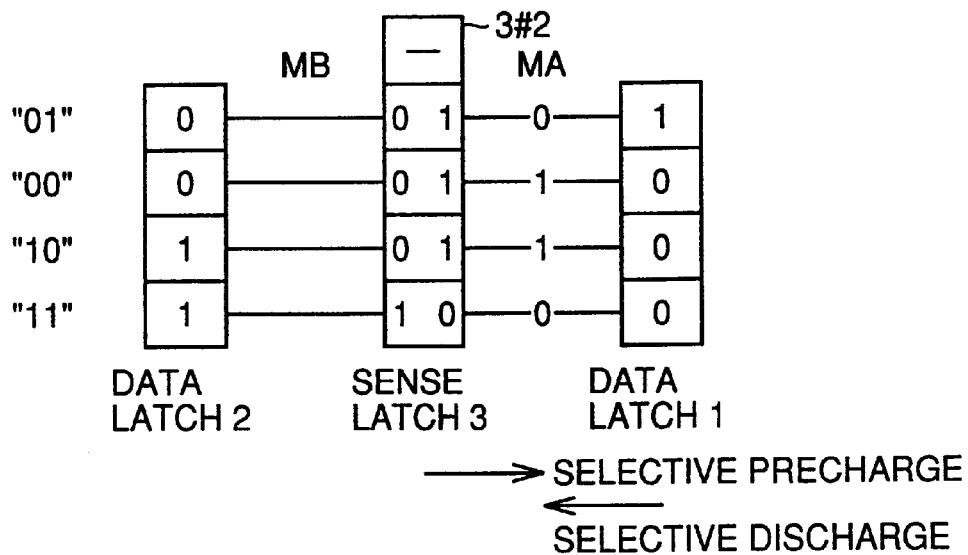
FIGS. 11A and 11B illustrate a read sequence for multivalued data in the flash memory 1000.

Then, the control CPU 16 performs operation processing (see FIG. 11A). In the operation processing, the control CPU 16 performs selective precharging on the bit lines of the memory cell array MA on the basis of the sense latches 3#1 and performs selective discharging on the basis of the data latches 1. Thus, the data of the data latches 1 and the data of the sense latches 3#1 are subjected to XOR (exclusive OR) processing.

Figure 11B:
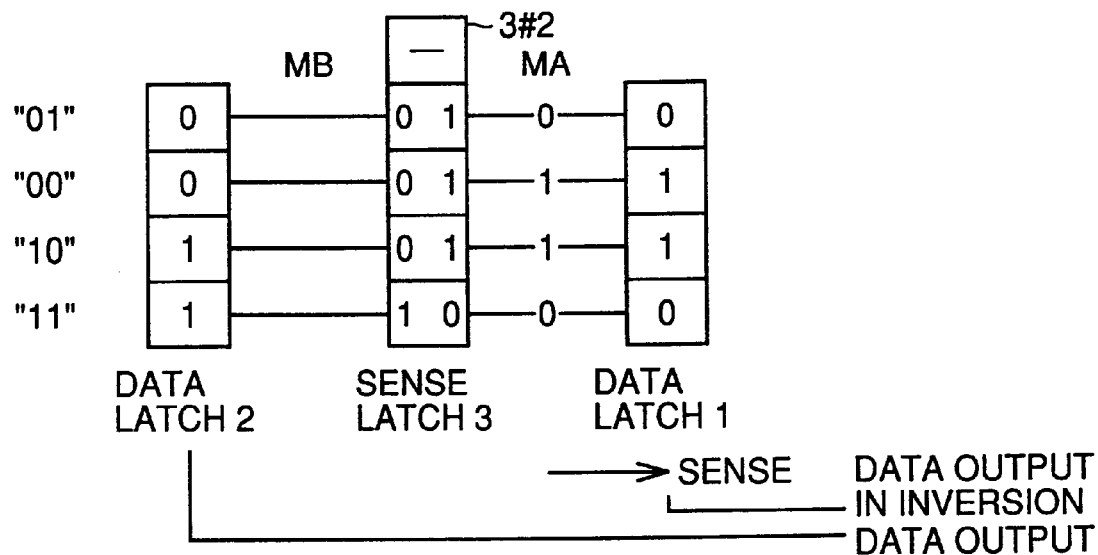

Then, the control CPU 16 performs output processing (see FIG. 11B). More specifically, the data latches 1 perform sensing. The data latches 1 latch data ("0", "1", "1", "0") corresponding to the potentials of the bit lines of the memory cell array MA. The control CPU 16 outputs the data ("0", "0", "1", "1") of the data latches 2 and data obtained by inverting the data of the data latches 1. Thus, it follows that the control CPU 16 reads multivalued data ("01", "00", "10", "11").

Figures 12, 13:
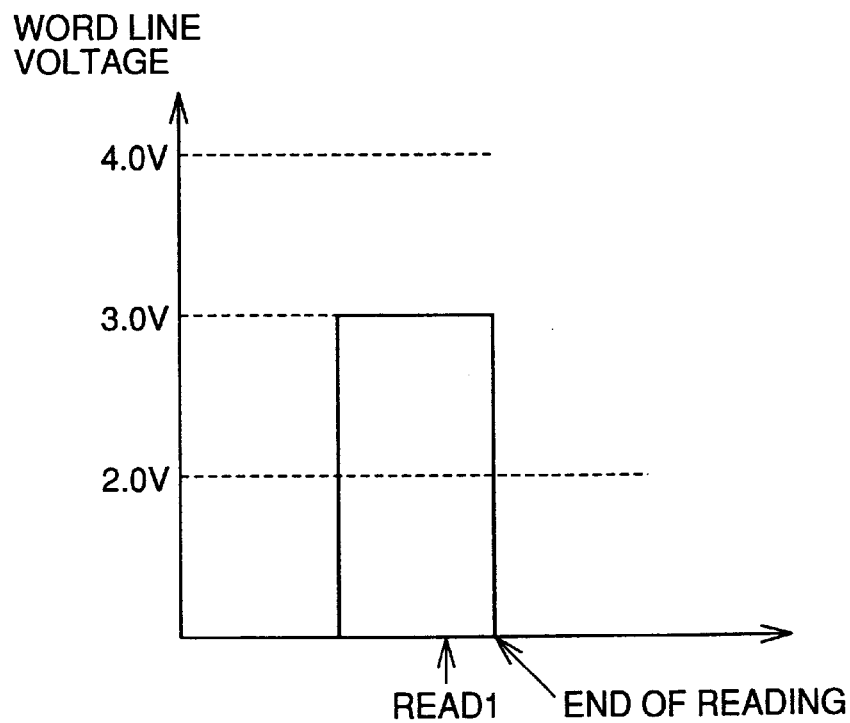
FIG. 12 illustrates the relation between data and values of the sense latches in the multivalued data read operation of the flash memory 1000.
FIG. 13 illustrates word line voltages in a binary data read operation of the flash memory 1000.

FIG. 12 shows data (the values of the data latches after the three read operations) and values latched in the sense latches 3 in the respective read operations.

Figure 14A:
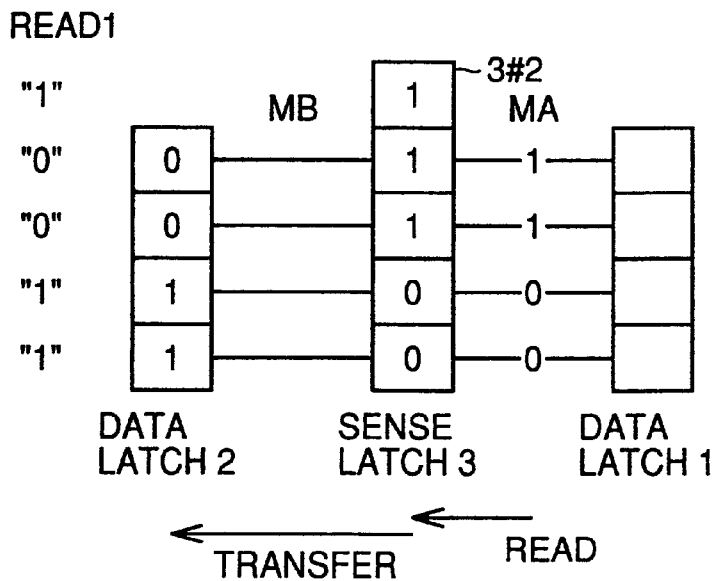
FIGS. 14A and 14B are diagrams for illustrating a read sequence for binary data in the flash memory 1000.
Figure 14B:
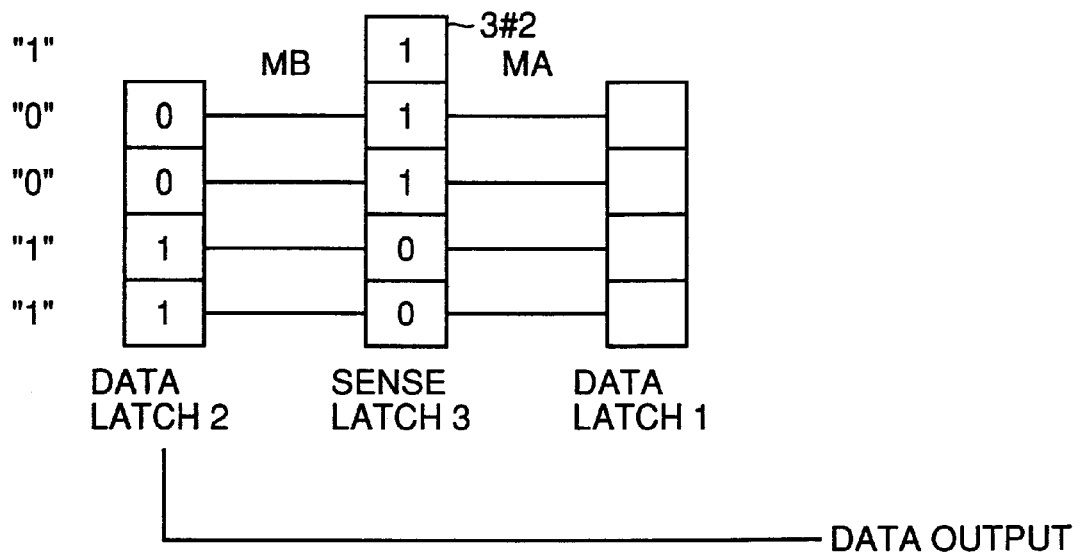

In binary data reading, the flash memory 1000 executes a read sequence for binary data shown in FIGS. 13, 14A and 14B. When the data of the multivalued flag MF read in a first read operation READ1 is "1", the control CPU 16 terminates the reading in the read operation READ1 as shown in FIG. 13.

In the read operation READ1 (see FIG. 14A), the control CPU 16 reads data of any memory cells M of the memory cell array MA and the multivalued flag MF corresponding to the memory cells M. The sense latches 3#1 latch the data ("1", "1", "0", "0") of the memory cells M and the sense latch 3#2 latches the data ("1") of the multivalued flag MF.

The data of the multivalued flag MF is "1" and hence the control CPU 16 makes control for executing the read sequence for binary data. The sense latches 3#1 transfer the data to the data latches 2 (transfer). The data latches 2 latch inverted data of the read data.

Figures 15, 16:
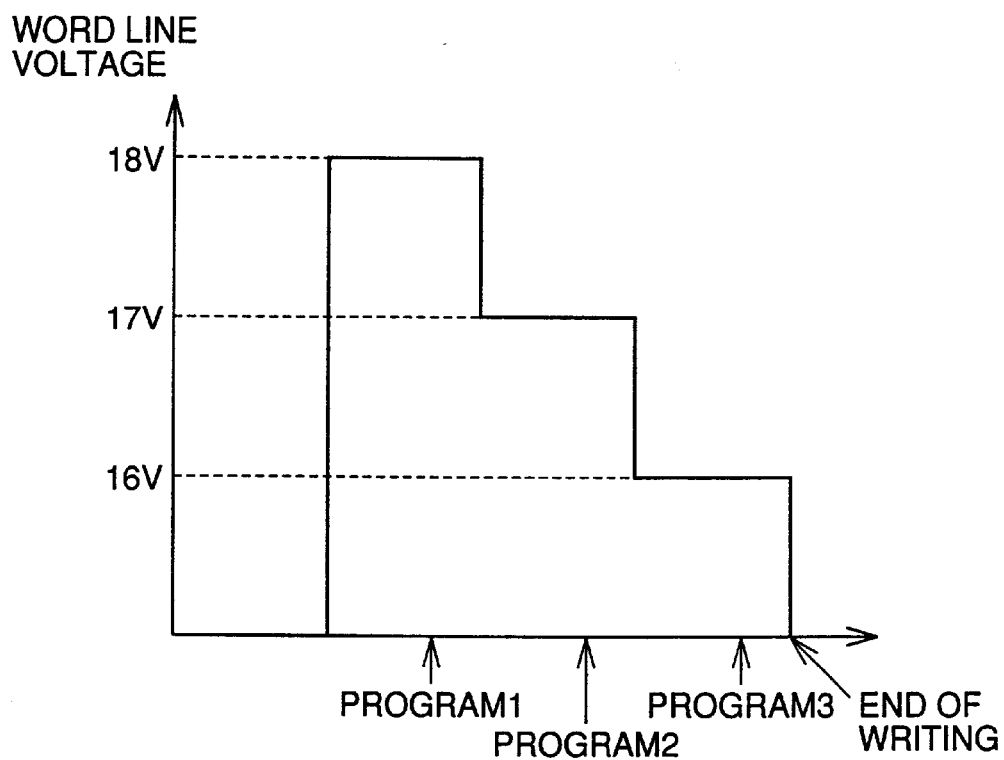
FIG. 15 illustrates the relation between data and values of the sense latches in the binary data read operation of the flash memory 1000.
FIG. 16 illustrates word line voltages in a write operation of the multivalued flash memory.

Then, the control CPU 16 performs output processing (see FIG. 14B). More specifically, the control CPU 16 outputs the data ("0", "0", "1", "1") of the data latches 2. Thus, it follows that the control CPU 16 reads binary FIG. 15 shows the relation between data (the values of the data latches after a single read operation) and the values latched in the sense latches 3 in the single read operation. Thus, the reading can be terminated in the single read operation on the basis of the value of the multivalued flag MF.

A data write sequence in the flash memory 1000 is now described in detail in comparison with the multivalued flash memory storing only multivalued data.

The multivalued flash memory executes a write sequence shown in FIGS. 16 to 19B. It is assumed that the multivalued flash memory writes multivalued data ("01", "00", "10" and "11") with the data latches 1 and 2 and the sense latches 3 similarly to the flash memory 1000.

Referring to FIG. 16, the multivalued flash memory executes three write operations PROGRAM1, PROGRAM2 and PROGRAM3. The word line voltage is set to 18 V in the write operation PROGRAM1, to 17 V in the write operation PROGRAM2, and to 16 V in the write operation PROGRAM3.

The multivalued flash memory writes the data "01" in the write operation PROGRAM1, the data "00" in the write operation PROGRAM2 and the data "10" in the write operation PROGRAM3.

FIGS. 17A to 17D show the processing in the write operation PROGRAM1.

Figure 17A:
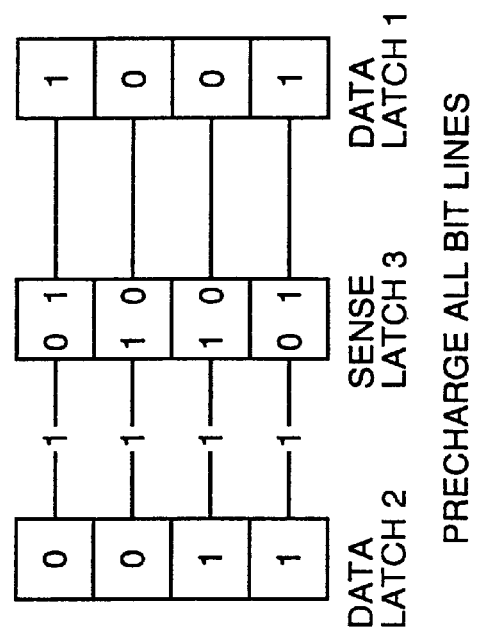
FIGS. 17A to 17D are diagrams for illustrating a write sequence (PROGRAM1) in the multivalued flash memory.

Referring to FIG. 17A, the data latches 1 store the first-bit data ("1", "0", "0", "1") and the data latches 2 store the second-bit data ("0", "0", "1", "1"). The data latches 1 transfer the data to the sense latches 3 (transfer).

Figure 17B:
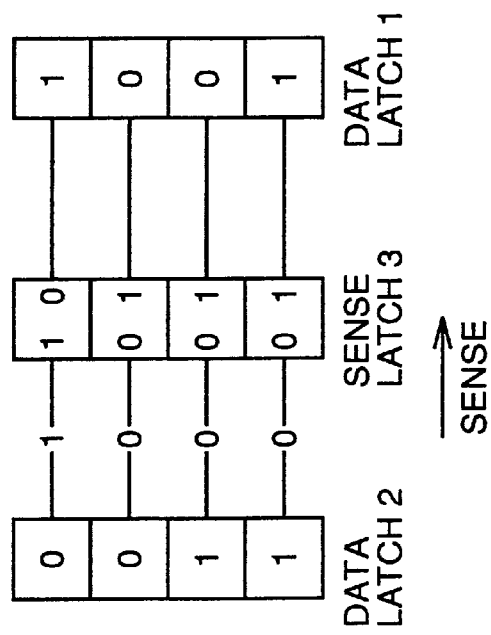
Figure 17C:
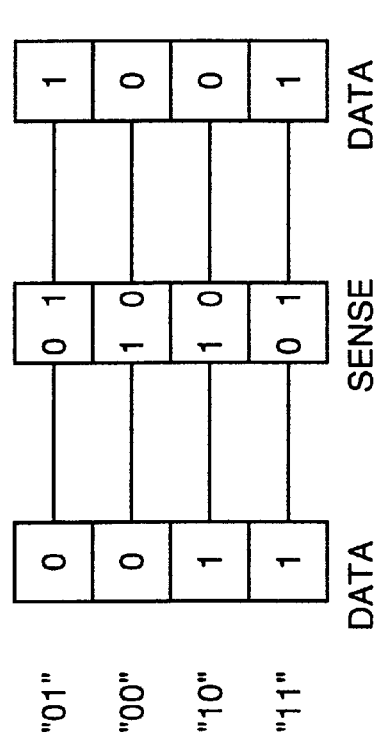

Referring to FIG. 17B, the multivalued flash memory precharges ("1") all bit lines between the data latches 2 and the sense latches 3. Referring to FIG. 17C, the multivalued flash memory performs selective discharge processing and selective discharging on the bit lines on the basis of the data latches 2 and the sense latches 3 respectively.

Figure 17D:
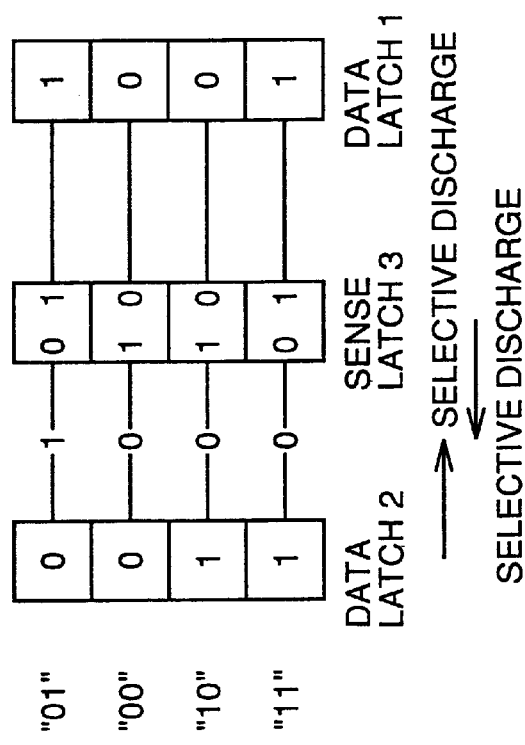

Referring to FIG. 17D, the sense latches 3 perform sensing. The sense latches 3 latch data ("1", "0", "0", "0") corresponding to the potentials of the bit lines and inverted data. Data "01" is written in the memory cells M connected with the sense latches 3 latching "0".

Figure 18A:
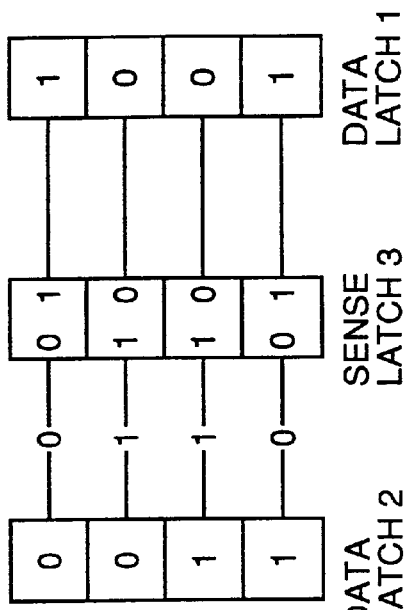
FIGS. 18A to 18D are diagrams for illustrating the write sequence (PROGRAM2) in the multivalued flash memory.
Figure 18B:
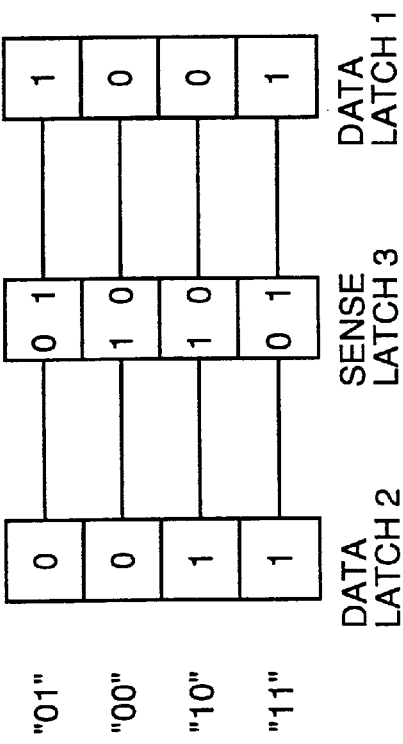
Figure 18C:
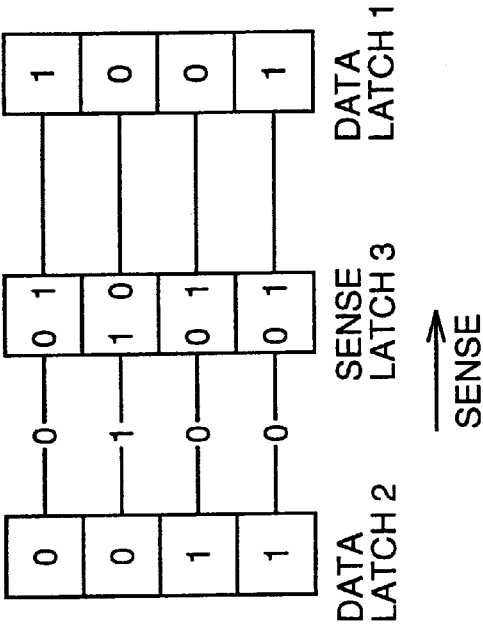
Figure 18D:
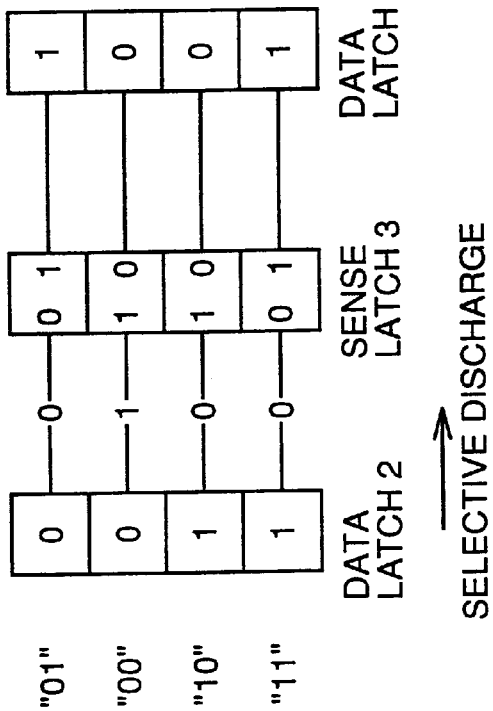

FIGS. 18A to 18D show the processing of the write operation PROGRAM2. Referring to FIG. 18A, the data latches 1 transfer the data to the sense latches 3 (transfer). Referring to FIG. 18B, the multivalued flash memory performs selective precharging on the bit lines between the data latches 2 and the sense latches 3 on the basis of the sense latches 3. Referring to FIG. 18C, the multivalued flash memory performs selective discharging on the bit lines on the basis of the data latches 2. Referring to FIG. 18D, the sense latches 3 perform sensing. The sense latches 3 latch data ("0", "1", "0", "0") corresponding to the potentials of the bit lines and inverted data. Data "00" is written in the memory cells M connected with the sense latches 3 latching "0".

Figure 19A:
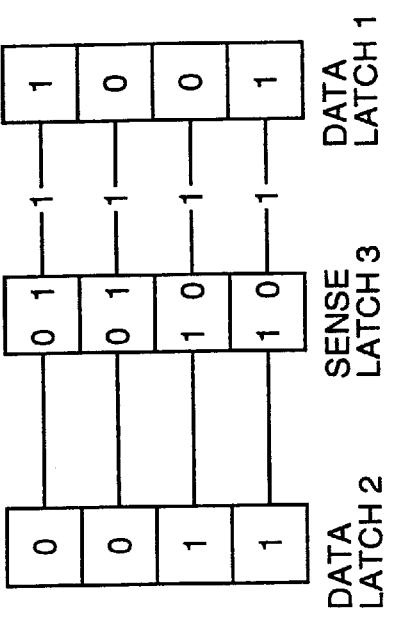
FIGS. 19A to 19D are diagrams for illustrating the write sequence (PROGRAM3) in the multivalued flash memory.
Figure 19B:
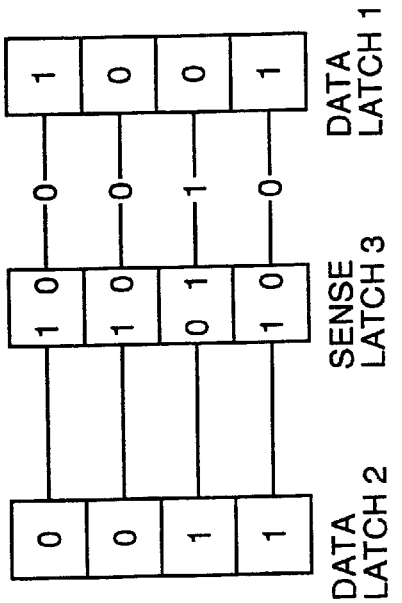
Figure 19C:
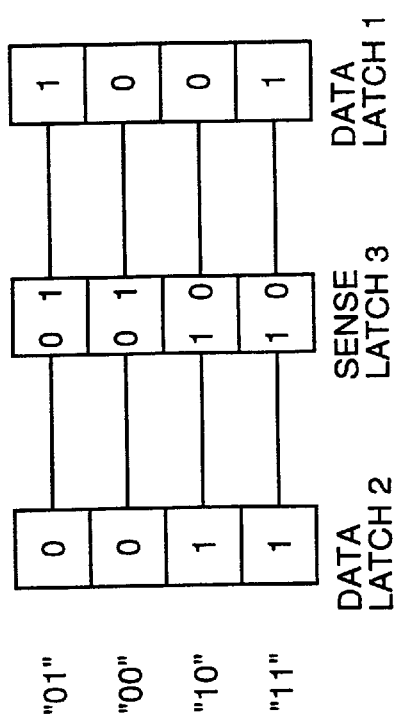

FIGS. 19A to 19D shows the processing of the write operation PROGRAM3. Referring to FIG. 19A, the data latches 1 transfer the data to the sense latches 3 (transfer). Referring to FIG. 19B, the multivalued flash memory precharges ("1") all bit lines between the sense latches 3 and the data latches 1. Referring to FIG. 19C, the multivalued flash memory performs selective discharging on the bit lines on the basis of the sense latches 3 and on the basis of the data latches 1 respectively.

Figure 19D:

Referring to FIG. 19D, the sense latches 3 perform sensing. The sense latches 3 latch data ("0", "0", "1", "0") corresponding to the potentials of the bit lines and inverted data. Data "10" is written in the memory cells M connected with the sense latches 3 latching "0".

Figures 20, 21:
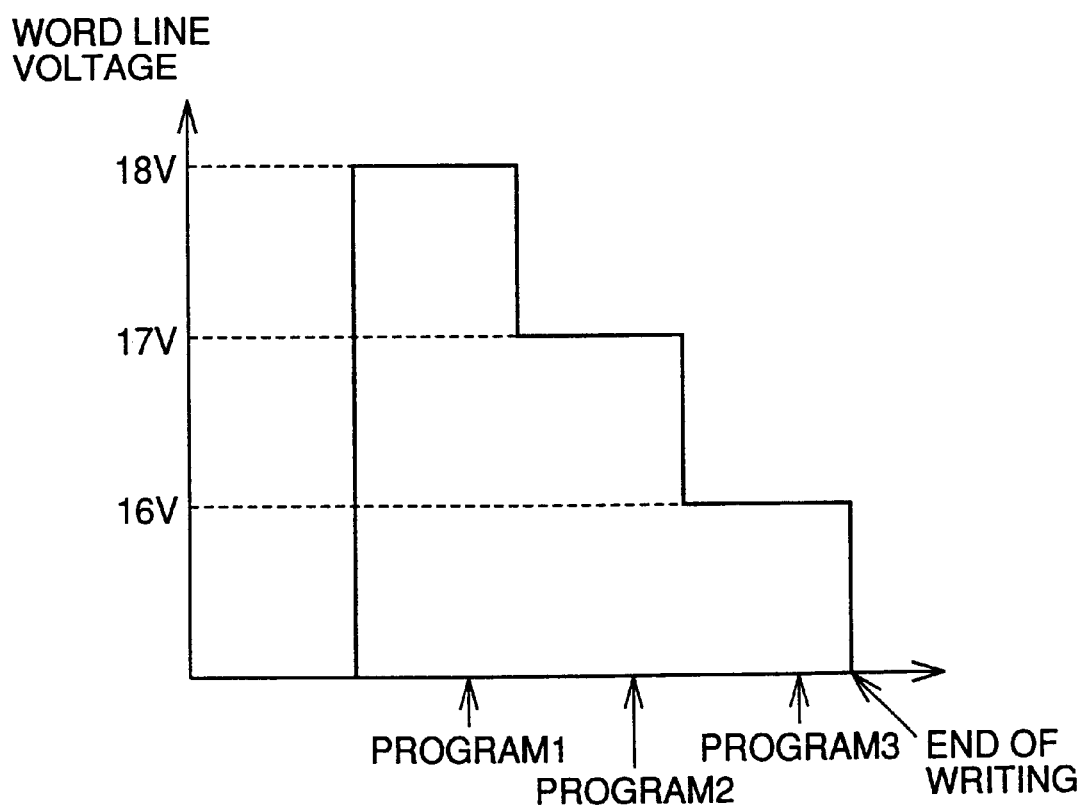
FIG. 20 illustrates the relation between data and values in the sense latches in a write operation of the multivalued flash memory.
FIG. 21 illustrates word line voltages in a multivalued data write operation of the flash memory 1000.

FIG. 20 shows the relation between the data (values of the data latches 1 after data loading) and values latched in the sense latches 3 in the respective operations.

On the other hand, the flash memory 1000 executes a write sequence shown in FIGS. 21 to 22D for writing multivalued data.

Referring to FIG. 21, the flash memory 1000 executes three write operations PROGRAM11, PROGRAM2 and PROGRAM3. The word line voltage is set to 18 V in the write operation PROGRAM1, to 17 V in the write operation PROGRAM2 and to 16 V in the write operation PROGRAM3.

FIGS. 22A to 22D show the processing of the write operation PROGRAM1. Referring to FIG. 22A, the data latches 1 store first-bit data ("1", "0", "0", "1") and the data latches 2 store second-bit data ("0", "0", "1", "1"). The data latches 1 transfer the data to the sense latches 3#1 (transfer).

At the same time, the sense latch 3#2 stores "0" on the side of the memory array MA for writing "0" in the multivalued flag MF of the memory cell array MA.

Referring to FIG. 22B, the flash memory 1000 precharges ("1") all bit lines of the memory cell array MB. Referring to FIG. 22C, the flash memory 1000 performs selective discharging on the bit lines of the memory cell array MB on the basis of the data latches 2 and on the basis of the sense latches 3#1 respectively.

Referring to FIG. 22D, the sense latches 3#1 perform sensing. The sense latches 3#1 latch data ("1", "0", "0", "0") corresponding to the potentials of the bit lines and inverted data. Data "01" is written in the memory cells M connected with the sense latches 3#1 latching "0".

The contents of the processing of the write operations PROGRAM2 and PROGRAM3 are identical to those of the aforementioned write operations PROGRAM2 and PROGRAM3 in the multivalued flash memory. Thus, data "00" and "10" are written.

Figures 23, 24:
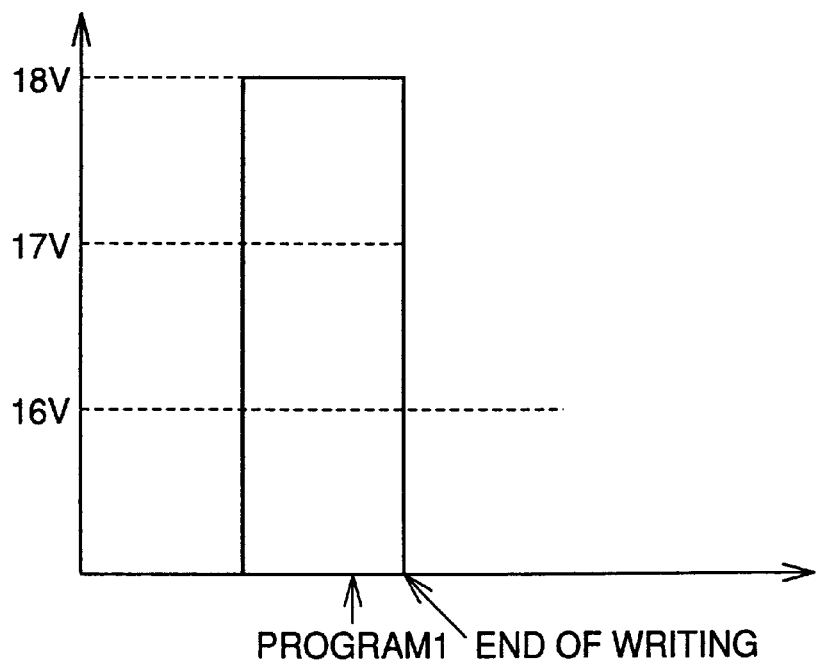
FIG. 23 illustrates the relation between data and values of the sense latches in the multivalued data write operation of the flash memory 1000.
FIG. 24 illustrates word line voltages in a binary data write operation of the flash memory 1000.

FIG. 23 shows the relation between data (values of the data latches after data loading) and values latched in the sense latches 3 in the respective write operations.

Thus, the data latches 2 latch write data in the sequence of writing multivalued data. When writing multivalued data "01", the corresponding sense latch is set to "0" while the sense latches for the memory cells corresponding to multivalued data other "01" are set to "1". Similarly, when writing multivalued data "00", the corresponding sense latch is set to "0" and the sense latches for the memory cells corresponding to multivalued data other than "00" are set to "1". When writing multivalued data "10", further, the corresponding sense latch is set to "0" and the sense latches for the memory cells corresponding to multivalued data other than "10" are set to "1". At this time, the multivalued flag MF stores a value indicating the multivalued data.

Figure 25A:
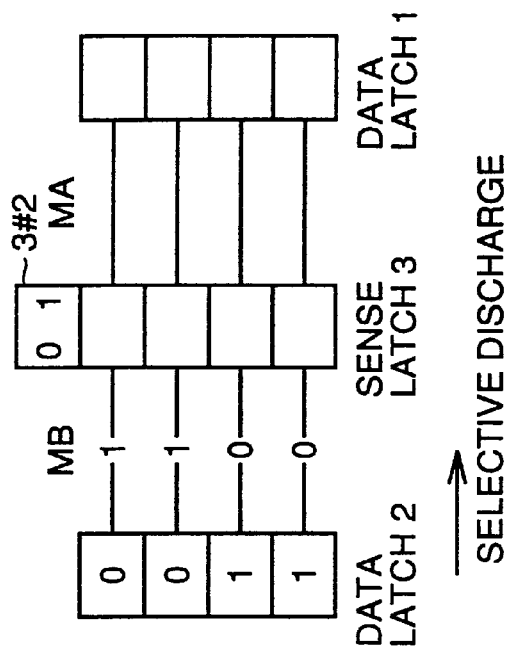
FIGS. 25A to 25C illustrate a write sequence (PROGRAM1) for binary data in the flash memory 1000.
Figure 25B:
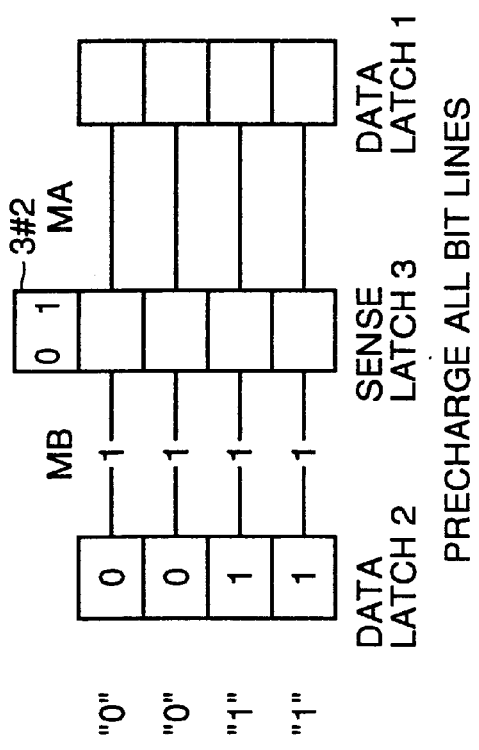
Figure 25C:
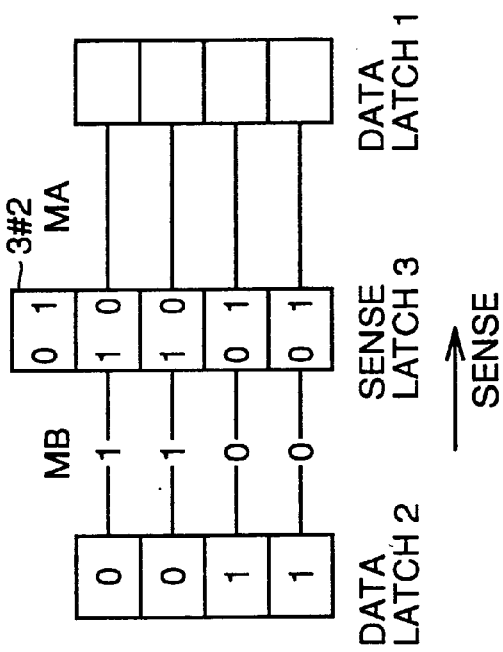

The flash memory 1000 executes a write sequence shown in FIGS. 24 to 25C for writing binary data.

Referring to FIG. 24, the flash memory 1000 executes a first write operation PROGRAM1. The word line voltage is set to 18 V in the write operation PROGRAM1.

FIGS. 25A to 25C show the processing of the write operation PROGRAM1. Referring to FIG. 25A, the data latches 2 store write data ("0", "0","1", "1"). At the same time, the sense latch 3#2 stores "1" on the side of the memory cell array MA for writing "1" in the multivalued flag MF in the memory cell array MA. The flash memory 1000 precharges ("1") all bit lines of the memory cell array MB.

Referring to FIG. 25B, the flash memory 1000 performs selective discharging on the bit lines of the memory cell array MB on the basis of the data latches 2. Referring to FIG. 25C, the sense latches 3#1 perform sensing. The sense latches 3#1 latch data ("1", "1", "0", "0") corresponding to the potentials of the bit lines and inverted data. Thus, data "0" (corresponding to data "01") is written in the memory cells M connected with the sense latches latching "0".

FIG. 26 shows the relation between data (values of the data latches after data loading) and values latched in the sense latches 3 in the single write operation.

Thus, the write operation can be terminated when writing the data "01" if a write request in the binary state is received.

Thus, the flash memory 1000 according to the first embodiment of the present invention can store multivalued data and binary data in combination with each other. Therefore, the flash memory 1000 can store data requiring high reliability in the binary state while storing data of a large volume in the multivalued state, for example, in response to write requests. Further, the flash memory 1000 can read multivalued data and binary data in the multivalued state and in the binary state respectively.

[Second Embodiment]

A second embodiment of the present invention relates to an exemplary improvement of the flash memory 1000. A control CPU 16 according to the second embodiment of the present invention makes control to perform three read operations when reading binary data similarly to multivalued data. When values of data read in the first read operation and the third read operation are different from each other, i.e., when the values reach thresholds corresponding to multivalued data "10" and "00", the control CPU 16 issues a warning indicating change of the thresholds of data stored in a binary state.

When issuing the warning, the control CPU 16 makes control for rewriting the binary data.

A read sequence for binary data in the flash memory according to the second embodiment of the present invention is described with reference to FIGS. 28 to 31C.

In the second embodiment of the present invention, the control CPU 16 executes three read operations READ1, READ2 and READ3 in total, as shown in FIG. 28. The word line voltage is set to 3.0 V in the read operation READ1, to 4.0 V in the read operation READ2 and to 2.0 V in the read operation READ3.

It is assumed that memory cells storing binary data enter a state of multivalued data "01" (0P), a state of multivalued data "00" ("0E"), a state of multivalued data "11" ("1P") and a state of multivalued data "10" ("1E"). The control CPU 16 detects the states "0E" and "1E" and issues a warning.

In the read operation READ1 (see FIG. 29A), the control CPU 16 reads data of memory cells M of a memory cell array MA and a multivalued flag MF corresponding to the memory cells M and latches the data in sense latches. Sense latches 3#1 store the data ("1", "1", "0", "0") corresponding to the memory cells M ("0P", "0E", "1E", "1P"), and a sense latch 3#2 stores the data ("1") of the multivalued flag MF on the side of the memory cell array MA. The sense latches 3#1 transfer the data to data latches 2 (transfer).

In the read operation READ2 (see FIG. 29B), the control CPU 16 reads data from the memory cells M. The sense latches 3#1 latch the read data ("1", "0", "0", "0"). The sense latches 3#1 transfer the data to data latches 1 (transfer).

In the read operation READ3 (see FIG. 29C), the control CPU 16 reads data from the memory cells M. The sense latches 3#1 latch the read data ("1", "1", "1", "0").

Figure 29A:
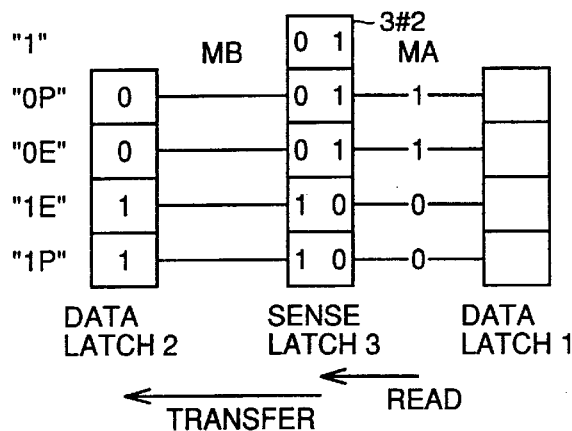
FIGS. 29A to 29E are diagrams showing a read sequence for binary data in the flash memory according to the second embodiment of the present invention.
Figure 29B:
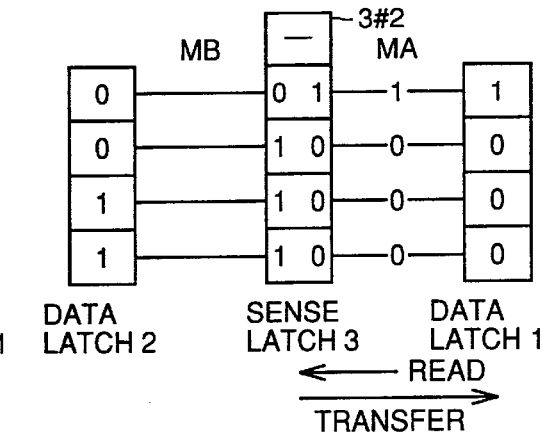
Figure 29C:
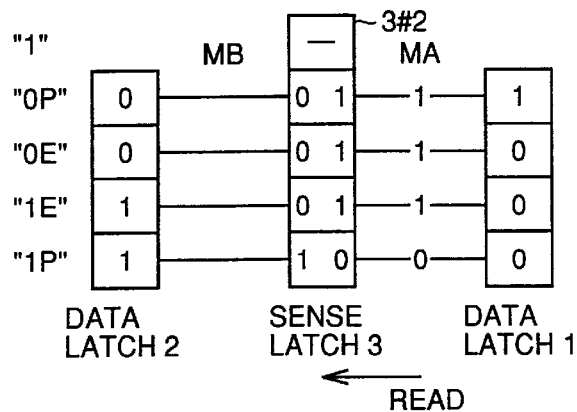
Figure 29D:
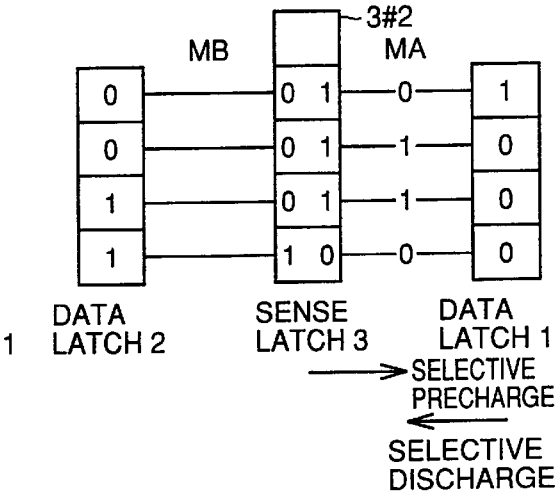

Then, the control CPU 16 performs operation processing (see FIG. 29D). In the operation processing, the control CPU 16 performs selective precharging and selective discharging on bit lines of the memory cell array MA on the basis of the sense latches 3#1 and on the basis of the data latches 1 respectively. Thus, the data of the data latches 1 and the data of the sense latches 3#1 are subjected to XOR processing.

Figure 29E:
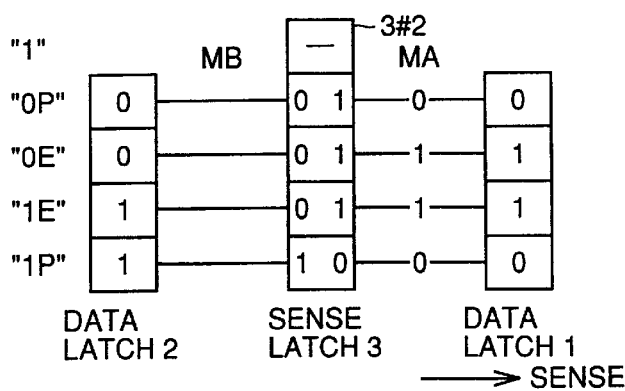

Then, the control CPU 16 performs output processing (see FIG. 29E). More specifically, the data latches 1 perform sensing. The data latches 1 latch data corresponding to the potentials of the bit lines of the memory cell array MA ("1", "1", "1", "0").

FIG. 32 shows the relation between data (values of the data latches 1 after the three read operations) and values latched in the sense latches 3#1 in the respective operations.

When reading binary data (the multivalued flag MF is "1"), the control CPU 16 further performs level 00 detection and level 10 detection.

Figure 30A:
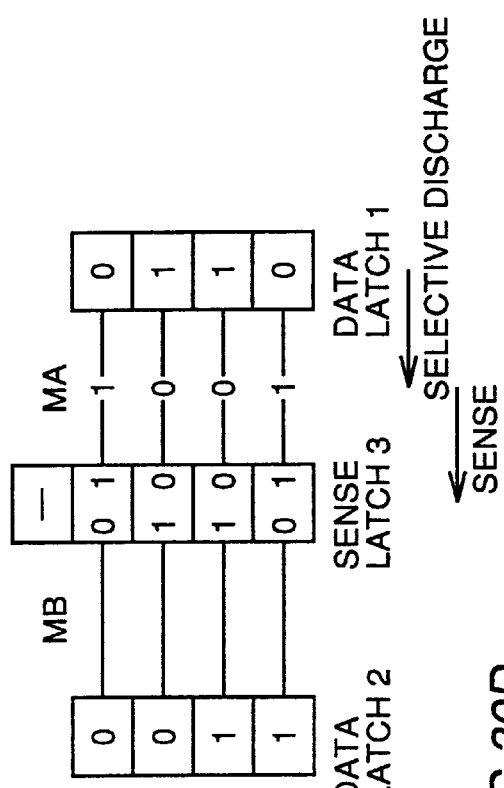
FIGS. 30A to 30D illustrate the contents of level 00 detection w processing in the second embodiment of the present invention.
Figure 30B:
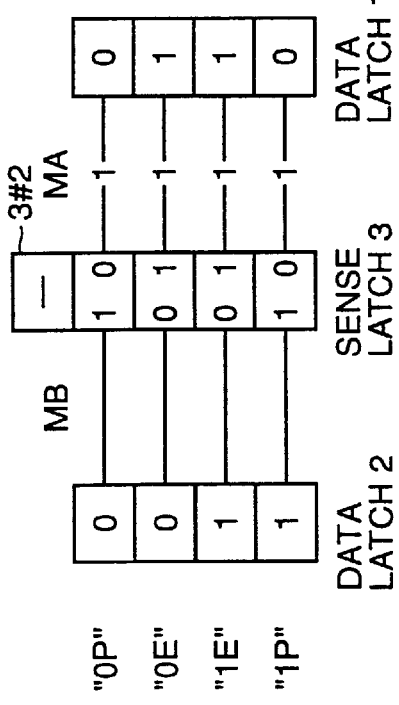
Figure 30C:
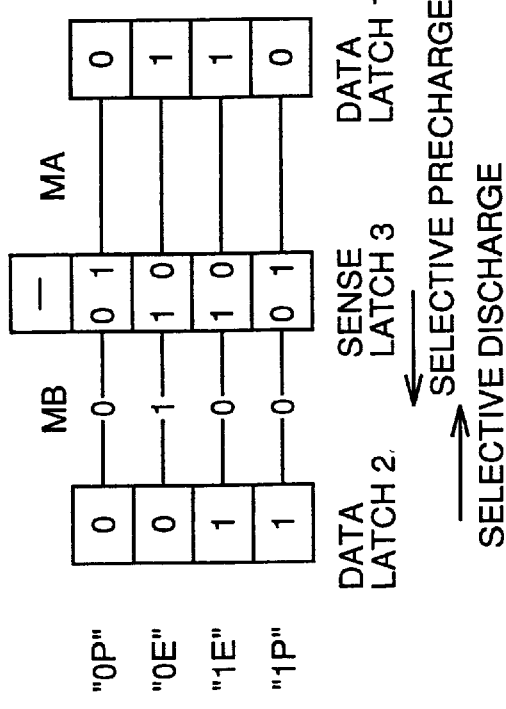
Figure 30D:
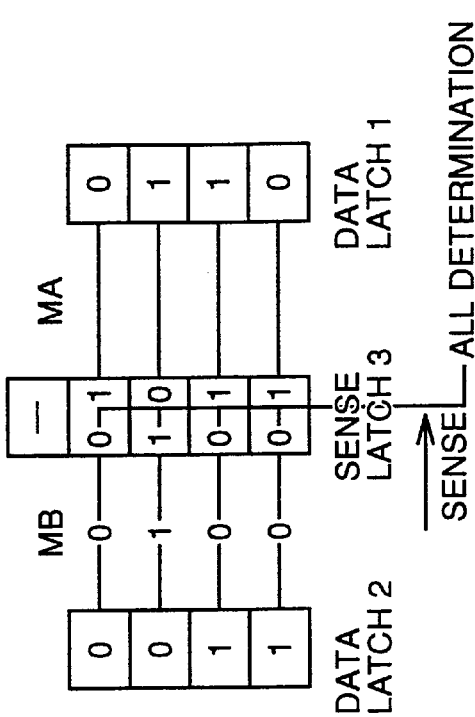
Figure 31A:
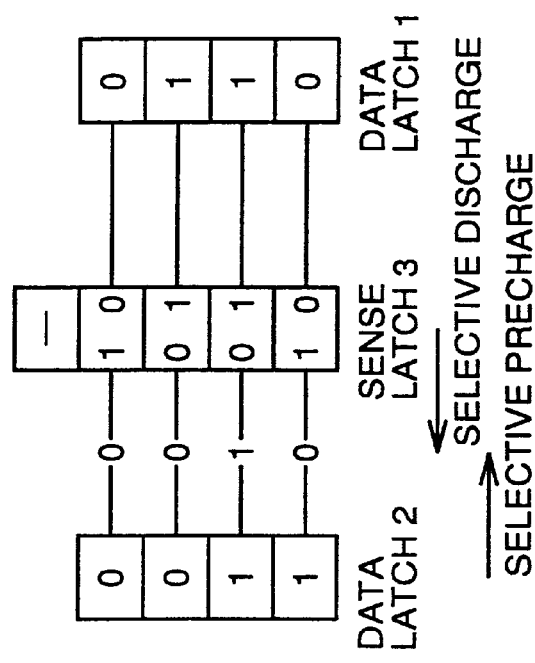
FIGS. 31A to 31C illustrate the contents of level 10 detection processing in the second embodiment of the present invention.
Figure 31B:
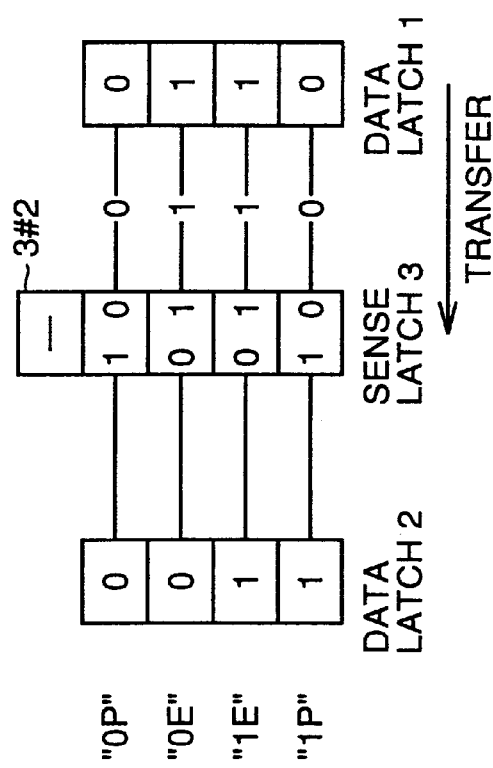
Figure 31C:
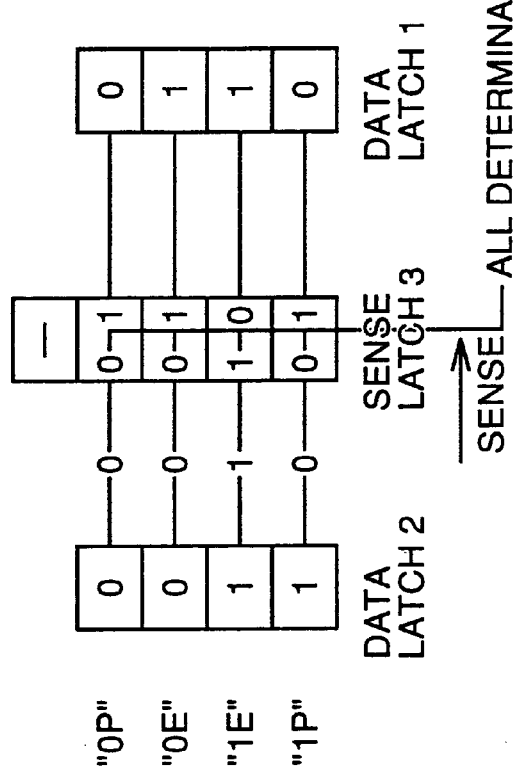

In the level 00 detection, the CPU 16 precharges all bit lines of the memory cell array MA as first processing (see FIG. 30A). In second processing (see FIG. 30B), the control CPU 16 performs selective discharging on the bit lines of the memory cell array MA on the basis of the data latches 1 while performing sensing in the sense latches 3#1.

In third processing (see FIG. 30C), the control CPU 16 performs selective precharging and selective discharging on bit lines of a memory cell array MB on the basis of the sense latches 3#1 and on the basis of the data latches 2 respectively. Further, the sense latches 3#1 perform sensing as fourth processing (see FIG. 30D). The sense latches 3#1 latch data corresponding to the potentials of the bit lines of the memory cell array MB ("0", "1", "0", "0 ").

The sense latch 3#1 corresponding to the memory cell of the state "0E" stores a value different from those of the sense latches 3#1 corresponding to the remaining memory cells. An all latch determination circuit 200 shown in FIG. 33 performs true/false determination (ALL determination) with the latched values. When terminating the fourth processing of the level 00 detection, the control CPU 16 performs the level 10 detection.

In first processing of the level 10 detection (see FIG. 31A), the data latches 1 transfer the data to the sense latches 3#1 (transfer). In subsequent second processing (see FIG. 31B), the control CPU 16 performs selective discharging and selective precharging on the bit lines of the memory cell array MB on the basis of the sense latches 3#1 and on the basis of the data latches 2 respectively.

In subsequent third processing (see FIG. 31C), the sense latches 3#1 perform sensing. The sense latches 3#1 latch data corresponding to the potentials of the bit lines of the memory cell array MB ("0", "0", "1", "0").

The sense latch 3#1 corresponding to the memory cell of the state "1E" stores a value different from those of the sense latches 3#1 corresponding to the remaining memory cells. The all latch determination circuit 200 shown in FIG. 33 performs ALL determination with the latched values.

Figure 33:
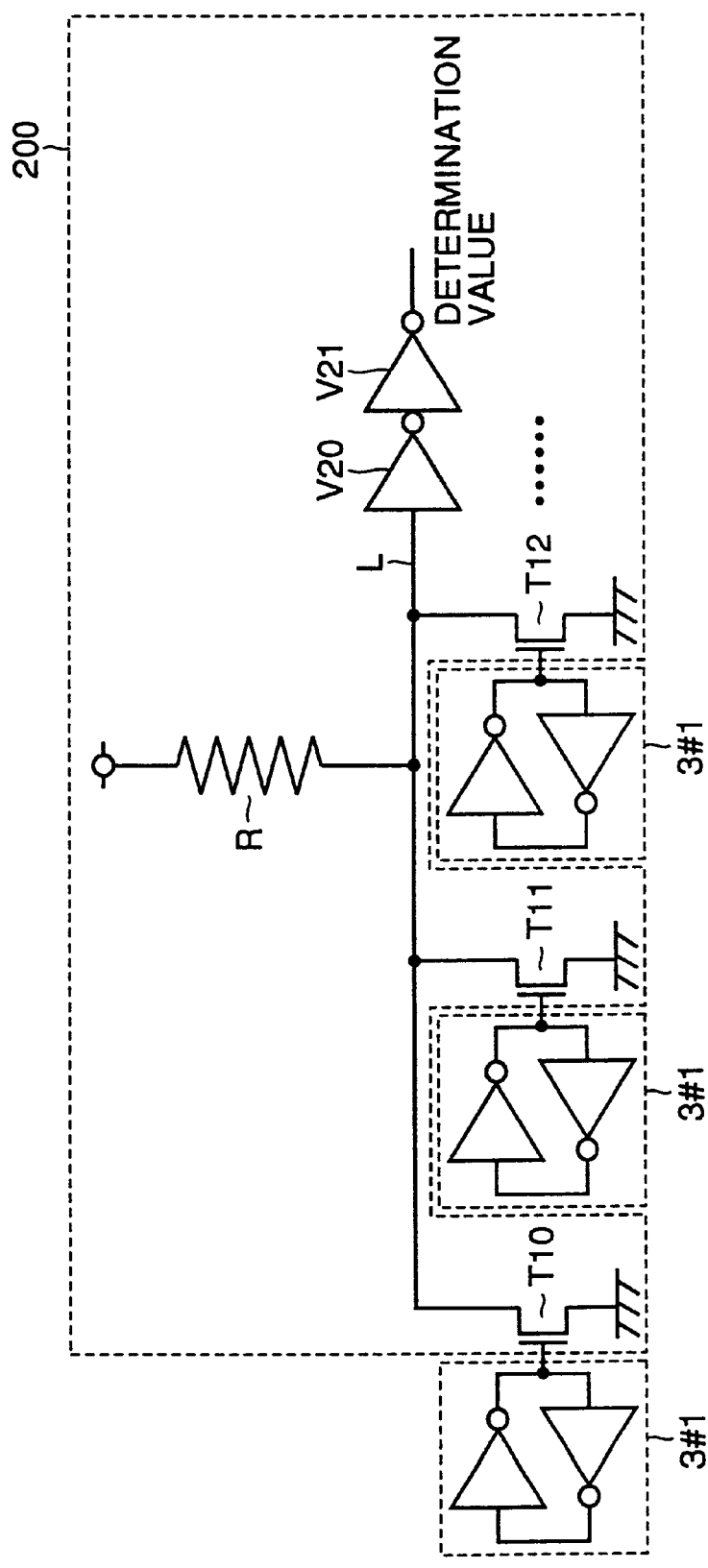
FIG. 33 is a circuit diagram showing the structure of an all latch determination circuit 200.

As shown in FIG. 33, the all latch determination circuit 200 performing ALL determination includes a plurality of NMOS transistors T10, T11, T12, . . . provided between a signal line L and nodes receiving a ground voltage, a resistive element R provided between the signal line L and a node receiving a power supply voltage and inverters V20 and V21 inverting a signal of the signal line L.

The transistors T10, T11, T12, . . . are provided in correspondence to a plurality of sense latches 3#1 respectively. Each of the transistors T10, T11, T12, . . . is turned on/off in response to the output from the corresponding sense latch 3#1.

When all sense latches 3#1 output low levels, the inverter V21 outputs a high-level determination value.

As shown in FIGS. 30A to 30D and 31A to 31C, therefore, a single sense latch 3#1 outputs a high-level signal and hence the determination value is low. On the basis of this determination value, the control CPU 16 rewrite the binary data for correcting displacement of thresholds and issues a warning signal indicating the displacement of the thresholds. The warning signal is output through a status register 18, for example.

Thus, the flash memory according to the second embodiment of the present invention can correctly store binary data. When detecting displacement of the binary data, the flash memory can post the occurrence of this displacement to an external device.

[Third Embodiment]

A third embodiment of the present invention relates to an exemplary improvement of the flash memory 1000. When receiving a write request for binary data "0", the flash memory 1000 according to the aforementioned first embodiment sets the memory cells M in the state of the multivalued data "01", i.e., the state of the highest threshold.

Figure 43:
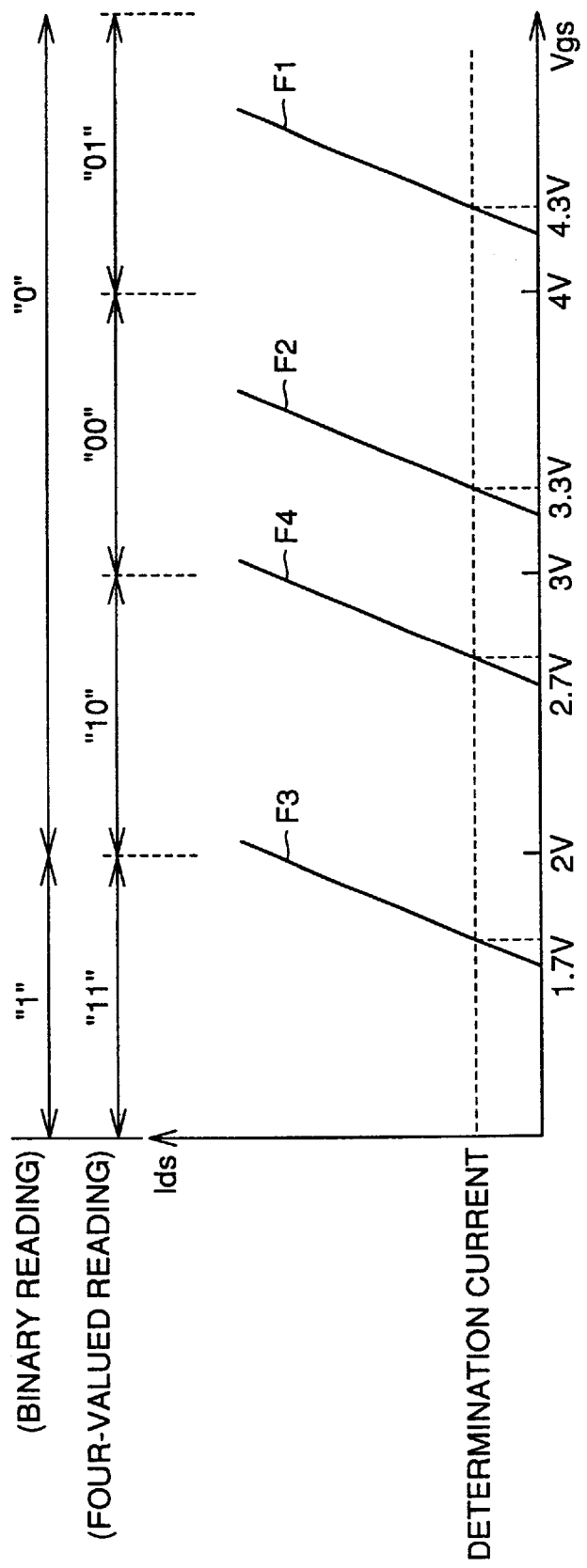
FIG. 43 illustrates the relation between multivalued data and binary data according to a third embodiment of the present invention.

A control CPU 16 according to the third embodiment of the present invention sets memory cells in the state of the multivalued data "10" closest to the state of the multivalued data "11" when receiving a write request for binary data "0" (see FIG. 43).

The amount of shifting of thresholds is smaller than that in the case of writing "01"and hence the write time can be reduced. Consequently, the flash memory according to the third embodiment of the present invention implements a high-speed write operation.

[Fourth Embodiment]

Figure 34:
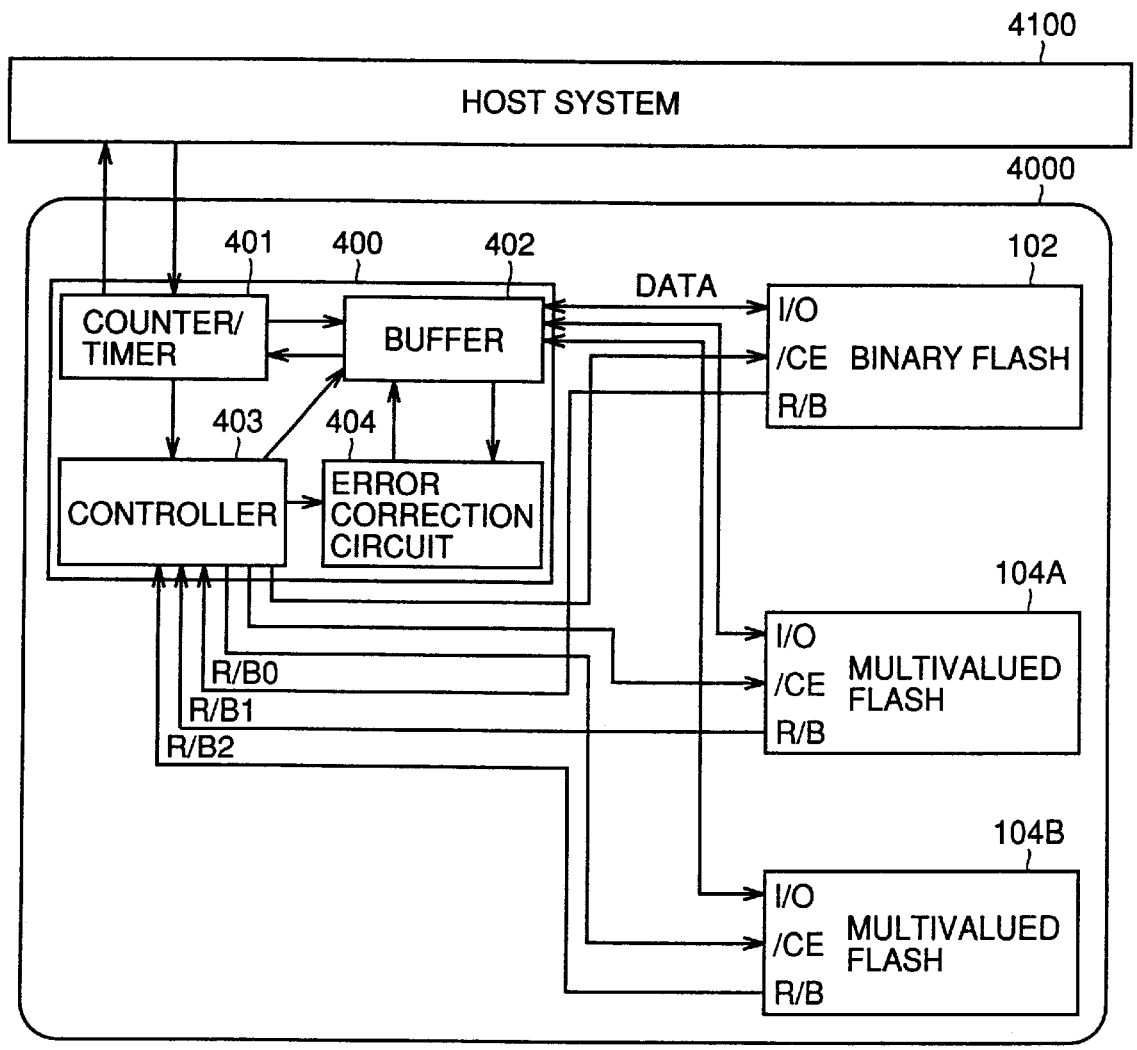
FIG. 34 is a diagram for illustrating a data storage system 4000 according to a fourth embodiment of the present invention.

A data storage system 4000 according to a fourth embodiment of the present invention is described with reference to FIG. 34. As shown in FIG. 34, the data storage system 4000 comprises a binary flash memory 102, multivalued flash memories 104A and 104B, and a system controller 400 including a counter/timer 401, a buffer 402, a controller 403 and an error correction circuit 404.

The binary flash memory 102 includes a plurality of nonvolatile memory cells. Binary data are written in and read from the memory cells included in the binary flash memory 102.

Each of the multivalued flash memories 104A and 104B includes a plurality of nonvolatile memory cells. Multivalued data are written in and read from the memory cells included in each of the multivalued flash memories 104A and 104B.

Each of the binary flash memory 102 and the multivalued flash memories 104A and 104B inputs/outputs data from an I/O (input/output) pin. The I/O pin is connected with the buffer 402.

The binary flash memory 102 outputs a signal R/B0 indicating whether or not the same is in operation from an R/B pin. The multivalued flash memories 104A and 104B output signals R/B1 and R/B2 indicating whether or not the same are in operation from R/B pins respectively. The signals R/B0, R/B1 and R/B2 are input in the controller 403.

Each of the binary flash memory 102 and the multivalued flash memories 104A and 104B receives a chip enable signal output from the controller 403 in a pin /OE to operate.

The counter/timer 401 measures the magnitude of write data required from a host system 4100 in a constant period. The counter/timer 401 outputs the result of the measurement to the controller 403.

The buffer 402 captures data transferred from the host system 4100 and data read from the flash memories 102, 104A and 104B.

On the basis of control by the controller 403, the error correction circuit 404 adds an error correction detection signal to write data captured in the buffer 402 and performs error correction on the data captured in the buffer 402 when transferring read data to the host system 4100.

The controller 403 monitors the output of the counter/timer 401 and the signals R/B0, R/B1 and R/B2 and controls data writing in the flash memories 102, 104A and 104B. The controller 403 further controls whether or not to perform error correction in data reading.

Figure 35:
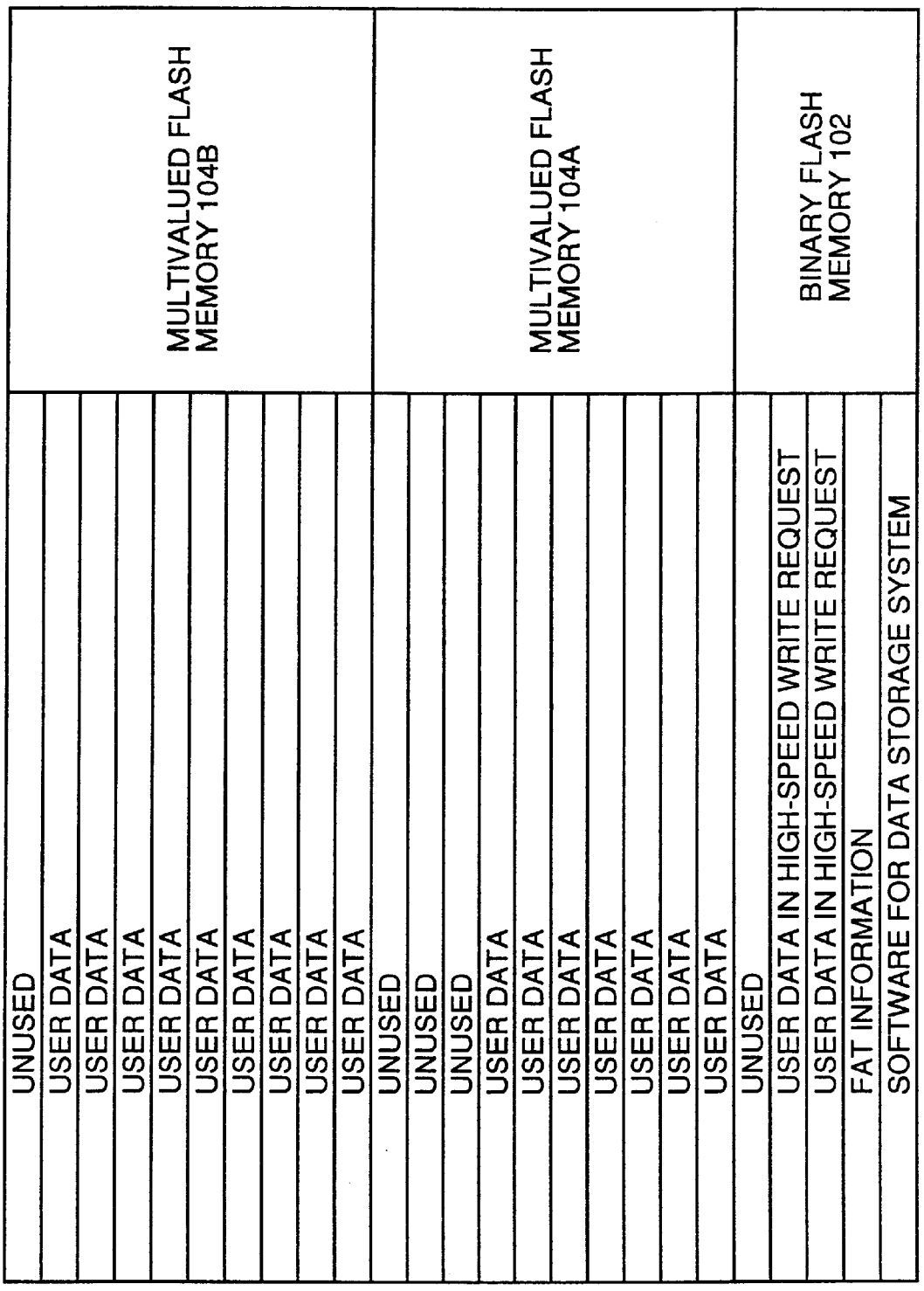
FIG. 35 illustrates exemplary data arrangement on an address space in the data storage system 4000.

As shown in FIG. 35, software for driving the data storage system 4000, FAT information (file information indicating the association between addresses of the flash memories 102, 104A and 104B and addresses in the data storage system 4000) and user data in a high-speed write request are written in the flash memory 102 having relatively high reliability and capable of a high-speed operation. Remaining user data are written in the multivalued flash memories 104A and 104B.

First exemplary write control in the flash memories 102, 104A and 104B by the system controller 400 is described in contrast with a data storage system having a plurality of only multivalued flash memories.

Figure 36:
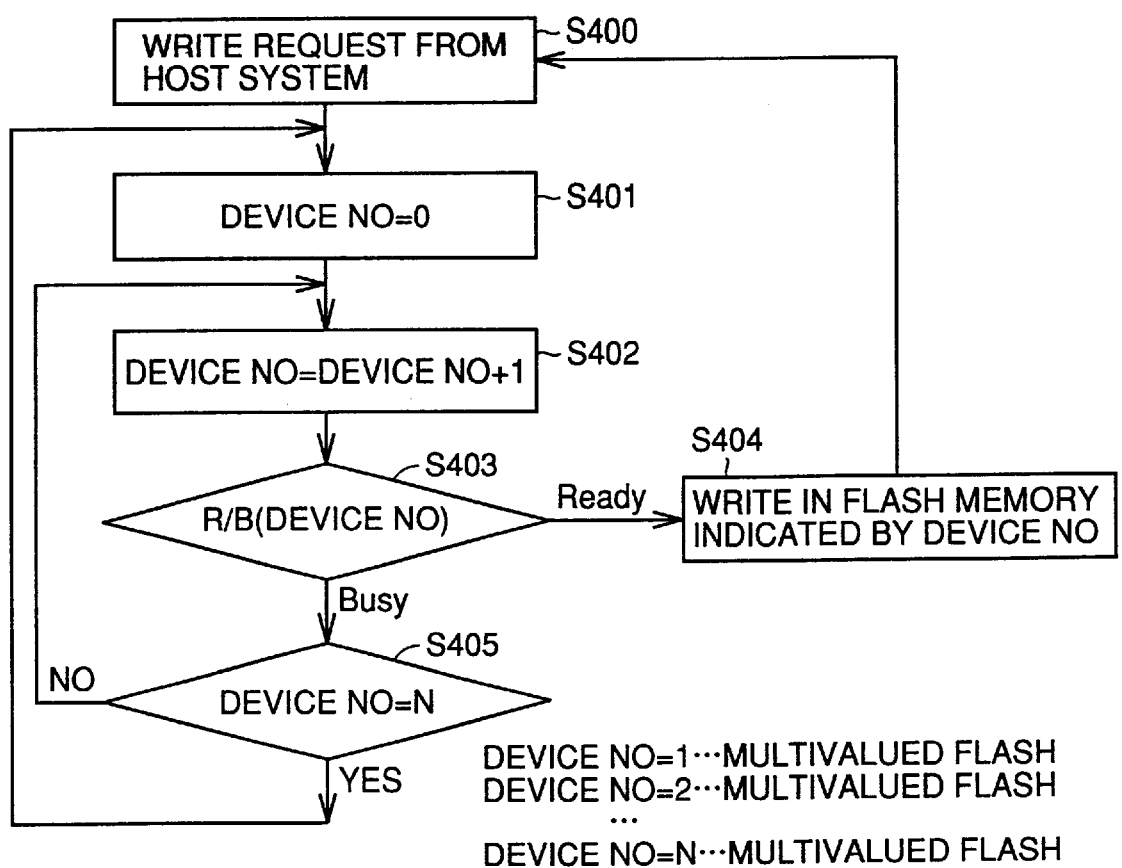
FIG. 36 is a flow chart showing write control in a data storage system formed by arranging a plurality of only multivalued flash memories.

When employing only multivalued flash memories, writing is performed in a procedure shown in FIG. 36. It is assumed that the data storage system has N multivalued flash memories. Device numbers 1 to N are assigned to the N multivalued flash memories respectively. When receiving a write request from a host system (step S400), the data storage system initializes the device number (DEVICE NO) specified as the object of writing to "0" (step S401).

Then, the data storage system increments the device number by "1" (step S402). The data storage system determines whether the corresponding multivalued flash memory in a writable (ready) state or an unwritable (busy) state in response to a signal R/B from this multivalued flash memory (step S403).

If the, multivalued flash memory is in the writable (ready) state, the data storage system writes data received from the host system in the multivalued flash memory corresponding to the device number (step S404). Then the storage system accepts a next write request from the host system (step S400).

If the multivalued flash memory is in the unwritable (busy) state, the system determines whether or not the device number has reached the maximum value "N" (step S405). If the device number is less than N, the process shifts to the processing of incrementing the device number by "1" (step S402). If the device number is "N", the process shifts to the processing of initializing the device number to "0" (step S401). Thus, the data storage system successively write data in ready flash memories among the plurality of multivalued flash memories.

Figure 37:
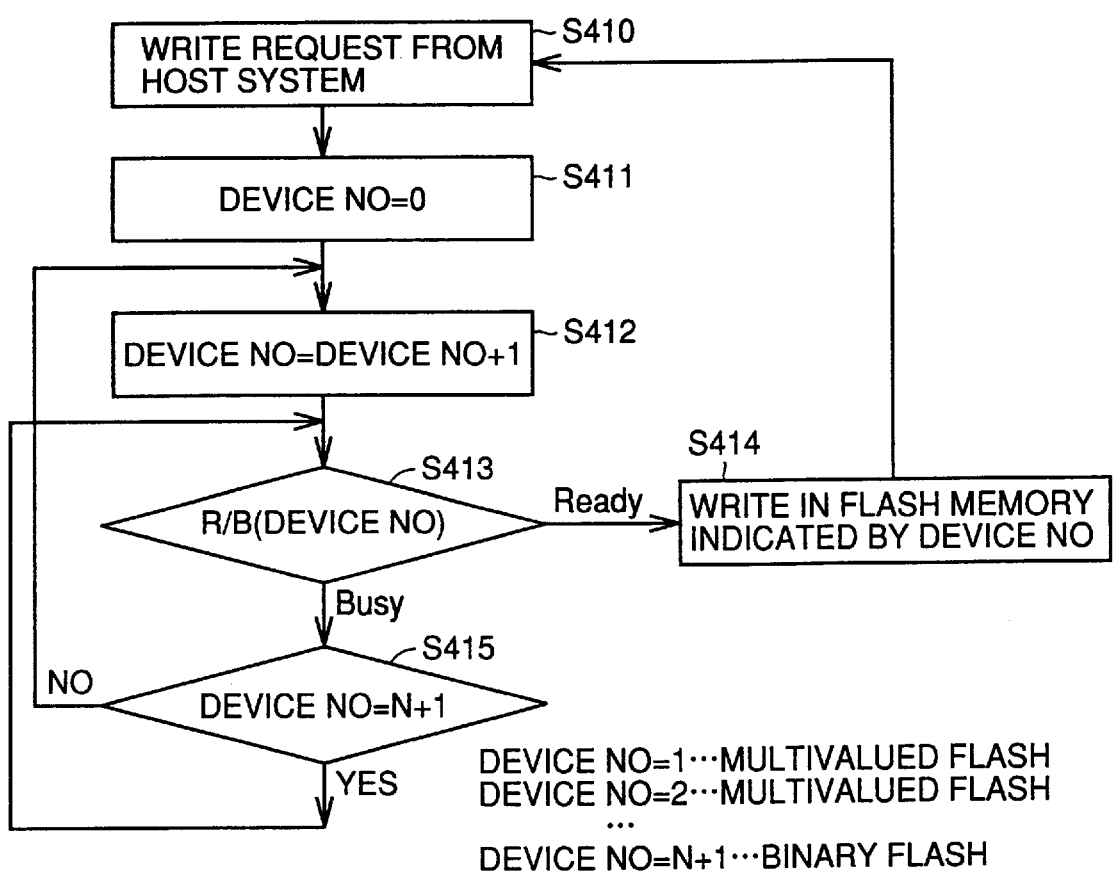
FIG. 37 is a flow chart showing first write control in the data storage system 4000.

On the other hand, the data storage system 4000 executes writing in a procedure shown in FIG. 37. It is assumed that the data storage system 4000 has N multivalued flash memories and a single binary flash memory. Device numbers 1 to N are assigned to the N multivalued flash memories respectively, and a device number (N+1) is assigned to the binary flash memory.

When receiving a write request from the host system 4100 (step S410), the system controller 400 initializes the device number subjected to writing to "0" (step S411). Then, the system controller 400 increments the device number by "1" (step S412). The system controller 400 determines whether the corresponding multivalued flash memory is in a writable (ready) state or an unwritable (busy) state in response to the signal R/B from this multivalued flash memory (step S413).

When the multivalued flash memory is in the writable (ready) state, the system controller 400 writes the data in the flash memory corresponding to the device number (step S414). Then, the system controller 400 accepts a next write request from the host system 4100 (step S410).

When the multivalued flash memory is in the unwritable (busy) state, the system controller 400 determines whether or not the device number has reached the maximum value "N+1" (step S415). If the device number is less than "N+1", the process shifts to the processing of incrementing the device number by "1" (step S412).

If the device number is "N+1", the process shifts to the processing of determining whether the corresponding flash memory (binary flash memory) is ready or busy (step S413).

The system controller 400 monitors the state (R/B) of the flash memory and makes control to perform data writing from the ready multivalued flash memory. When all multivalued flash memories are busy, the system controller 400 makes control to write data in the binary flash memory. The data storage system 4000 can store data of a large volume due to this operation.

Figure 38:
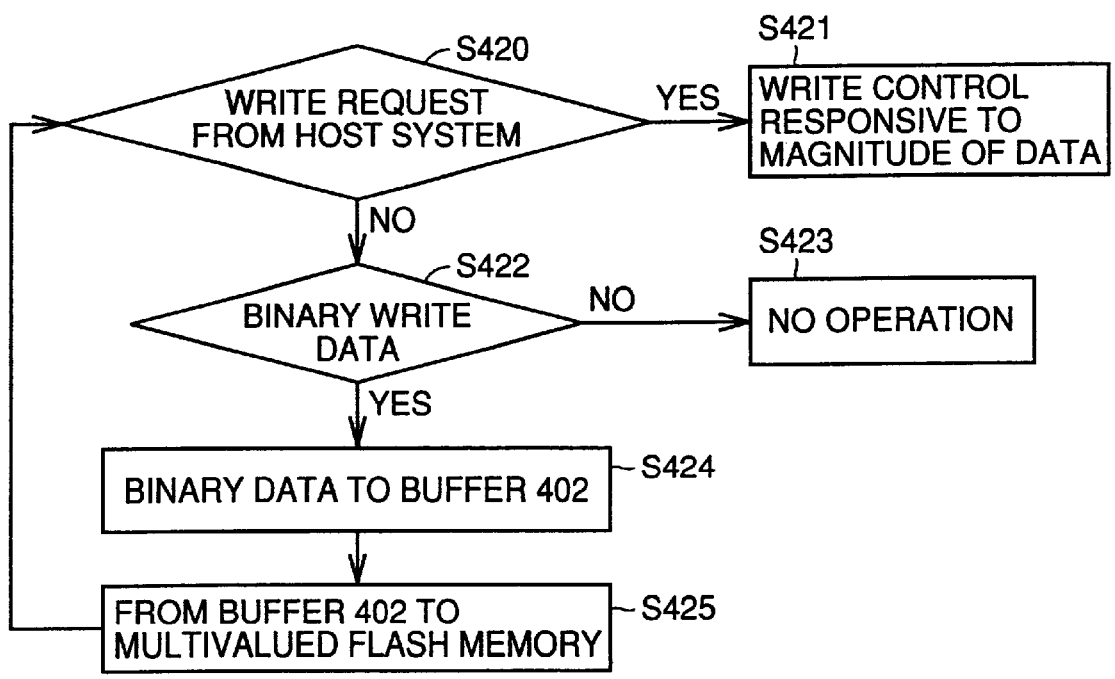
FIG. 38 is a flow chart showing second write control in the data storage system 4000.

Second exemplary write control by the system controller 400 is described with reference to FIG. 38. Referring to FIG. 38, the system controller 400 determines whether or not a write request is received from the host system 4100 (step S420). When receiving the write request, the process advances to write control processing (step S421) responsive to the magnitude of data described later.

When receiving no write request, the system controller 400 determines whether or not the user data in the high-speed write request is written in the binary flash memory 102 (step S422). When the binary flash memory 102 stores no user data in the high-speed write request, the system controller 400 performs no processing (step 423). When the user data in the high-speed write request is written in the binary flash memory 102, the system controller 400 makes the binary flash memory 102 to transfer the data to the buffer 402 (step S424).

The system controller 400 writes the data in any multivalued flash memory (step S425). The process shifts to the processing of determining a next write request from the host system 4100 (step 420).

In other words, the system controller 400 transfers the user data in the high-speed write request written in the binary flash memory 102 to the multivalued flash memory when receiving no write request from the host system 4100. Thus, high-speed writing and a large capacity can be compatibly implemented.

Figure 39:
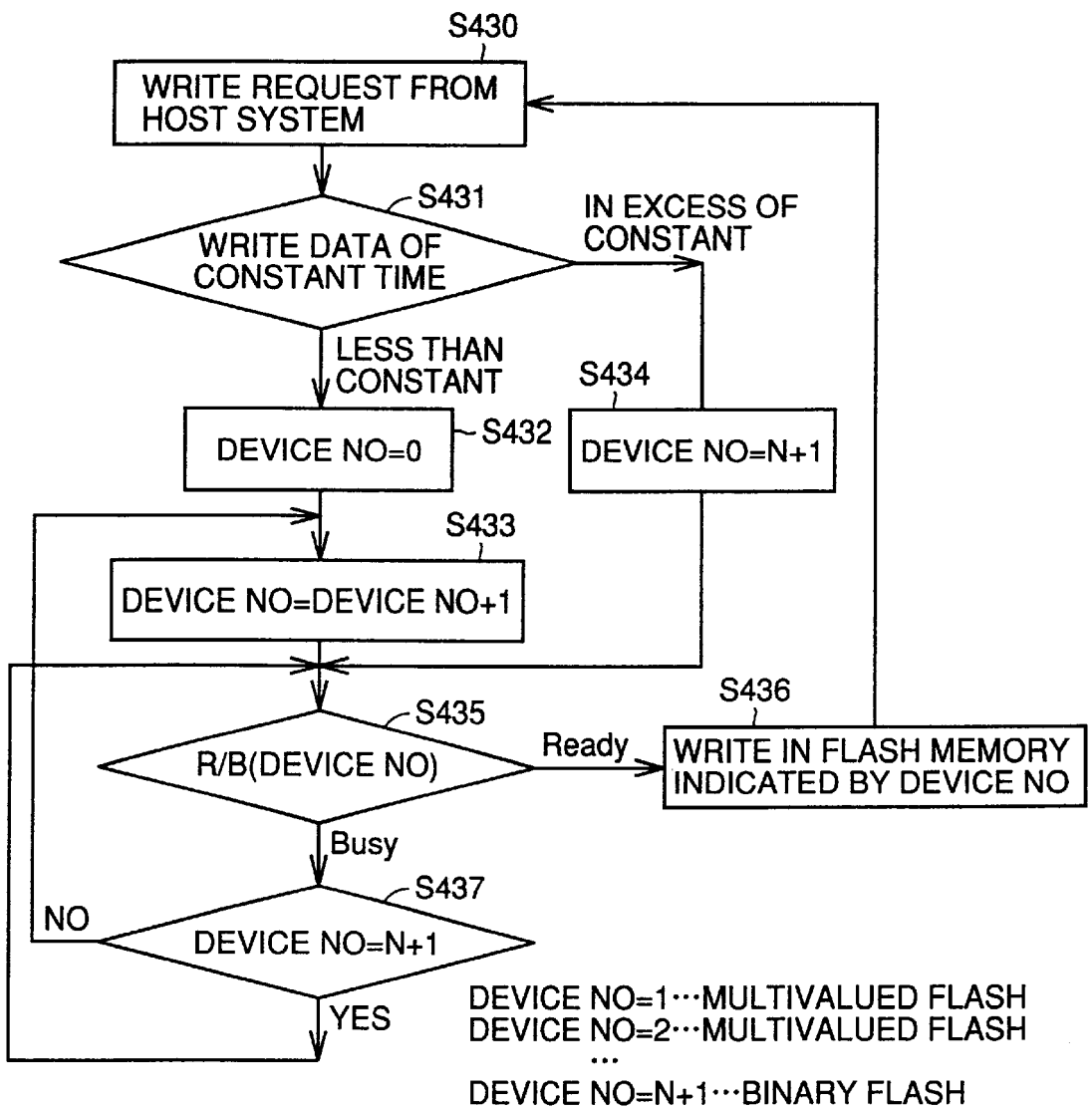
FIG. 39 is a flow chart showing write control responsive to the magnitude of write data in the data storage system 4000.

The write control (step S421) responsive to the magnitude of write data is described with reference to FIG. 39. When receiving a write request from the host system 4100 (step S430), the system controller 400 determines whether or not there is write data having a magnitude (reference value) of a constant time on the basis of the output from the counter/timer 401. If the magnitude of the write data is less than the reference value, the system controller 400 initializes the device number subjected to writing to "0" (step S432). Then, the system controller 400 increments the device number by "1" (step S433), and the process shifts to processing of determining a ready/busy state of the corresponding flash memory (step S435).

If the magnitude of the write data is in excess of the reference value, the system controller 400 sets the device number to "N+1" (step S434), and the process shifts to the processing of determining the ready/busy state of the corresponding binary flash memory (step S435).

When the corresponding flash memory is ready, the system controller 400 writes the data in this flash memory (step S436). Then, the system controller 400 accepts a next write request from the host system 4100 (step S430).

When the corresponding flash memory is busy, the system controller 400 determines whether or not the device number has reached the maximum value "N+1" (step S437). If the device number is less than "N+1", the process shifts to the processing of incrementing the device number by "1" (step S433).

When the device number is "N+1", the process shifts to the processing of determining whether the corresponding flash memory (binary flash memory) is ready or busy (step S435).

The system controller 400 determines that high-speed data writing is required when the data is large, and writes the data in the binary flash memory capable of a high-speed operation.

Figure 40:
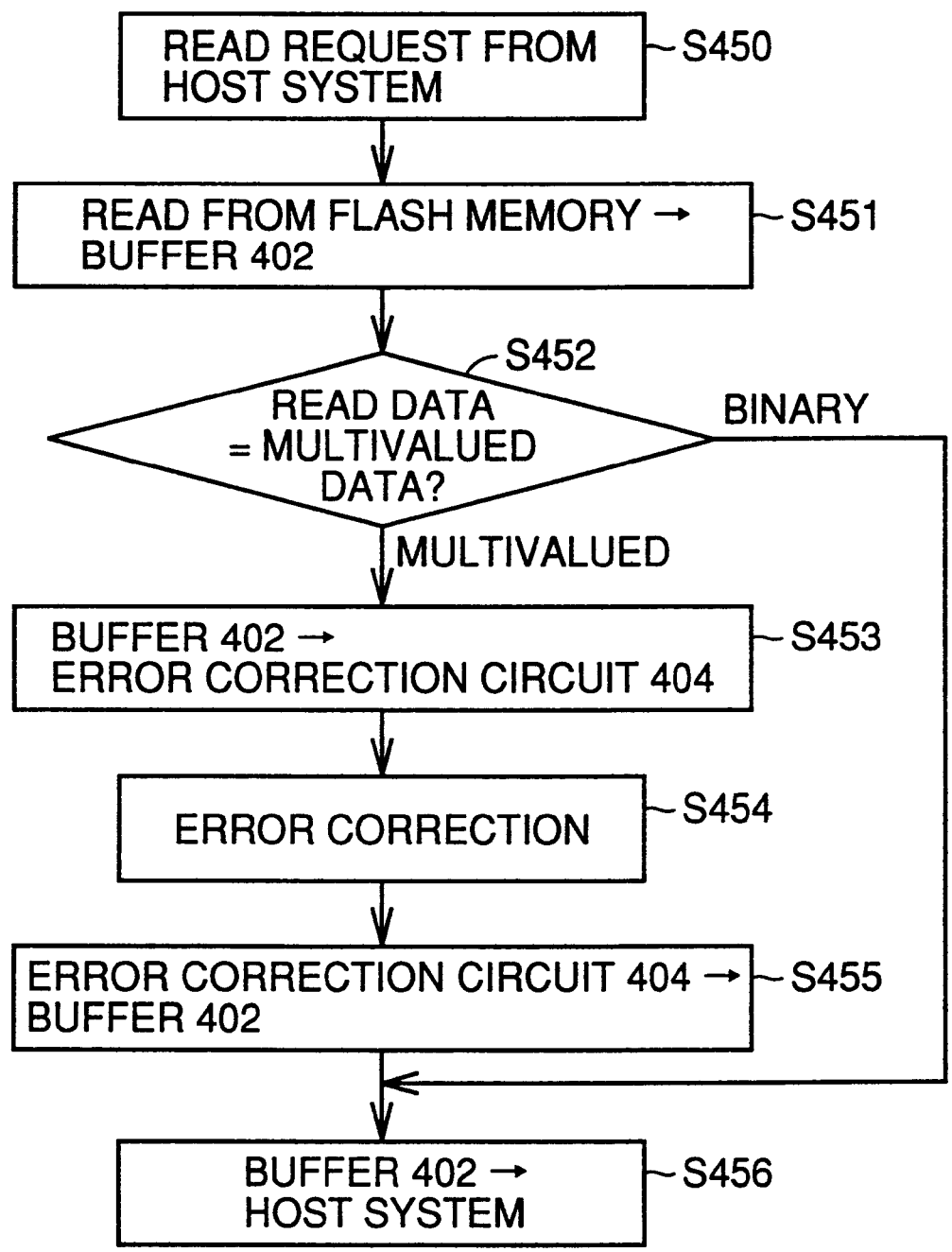
FIG. 40 is a flow chart showing read control in the data storage system 4000.

Exemplary read control by the system controller 400 is now described with reference to FIG. 40. When receiving a read request from the host system 4100 (step S450), the system controller 400 transfers corresponding data stored in any flash memory to the buffer 402 (step S451).

The system controller 400 determines whether or not the data transferred to the buffer 402 is read from any multivalued flash memory (step S452).

If the data is read from the binary flash memory, the system controller 400 performs no error correction in the error correction circuit 404 but the process shifts to processing of transferring the data from the buffer 402 to the host system 4100 (step S456).

If the data is read from the multivalued flash memory, the system controller 400 transmits the data transferred to the buffer 402 to the error correction circuit 404 (step S453). The error correction circuit 404 executes error correction (step S454). The buffer 402 stores the data subjected to error correction (step S455). Then the process shifts to the processing of transferring the data from the buffer 402 to the host system 4100 (step S456).

No error correction code is added in writing in the binary flash memory while an error correction code is added in writing in the multivalued flash memory. For the data read request from the host system 4100, the system controller 400 makes control to perform no error correction when reading the data from the binary flash memory having high reliability while performing error correction and thereafter transferring the data to the host system 4100 when reading the data from the multivalued flash memory. Thus, a high-speed operation can be implemented.

[Fifth Embodiment]

Figure 41:
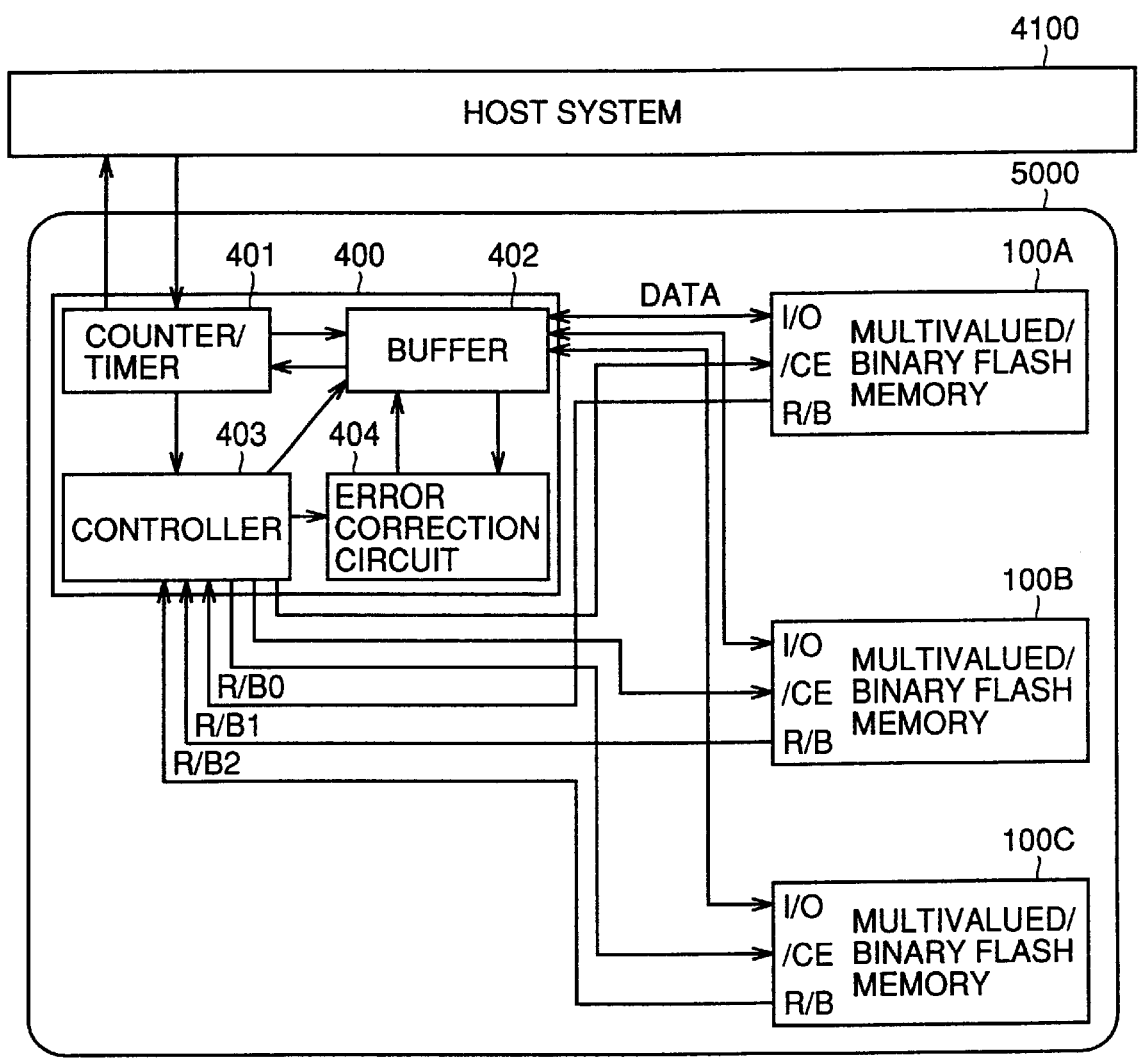
FIG. 41 is a diagram for illustrating a data storage system 5000 according to a fifth embodiment of the present invention.

A data storage system 5000 according to a fifth embodiment of the present invention is described with reference to FIG. 41. As shown in FIG. 41, the data storage system 5000 includes multivalued/binary flash memories 100A, 100B and 100C and a system controller 400. The multivalued/binary flash memories 100A to 100C having the structure described with reference to the first, second or third embodiment can store binary data or multivalued data in memory cells.

In the structure according to the fifth embodiment, user data and user data in a high-speed write request can be written in the flash memories 100A and 100B in multivalued and binary states respectively while the user data and the user data in the high-speed write request, software for driving the data storage system 5000 and FAT information (file information indicating association between addresses of the flash memories and addresses in the data storage system 5000) can be written in the flash memory 100C in multivalued and binary states respectively, as shown in FIG. 42.

The system controller 400 controls whether to store data in the multivalued state or in the binary state in response to the type of write data received from the host system 4100. The system controller 400 can also control whether or not to perform error correction in response to the type of the data.

When no write request is received and the user data (binary data) in the high-speed write request is written in the flash memories, the system controller 400 can transfer the data to a buffer 402 and store the data in the multivalued state through the buffer 402.

In the fourth embodiment, the multivalued flash memories may have no unused areas although the binary flash memory 102 has a large number of unused areas or the binary flash memory 102 may have no unused area although the multivalued flash memories have a large number of unused areas.

According to the fifth embodiment of the present invention, the flash memories in which multivalued data/binary data can be written and from which the written multivalued data/binary data can be read are arranged. Thus, a highly reliable high-speed operation can be performed while effectively using memory spaces.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a nonvolatile memory cell array including a plurality of memory cells; and a control circuit for controlling a write operation, a read operation and an erase operation for said plurality of memory cells, wherein said control circuit writes binary data or multivalued data in a memory cell subjected to writing in response to a write request and reads said binary data or said multivalued data in response to contents written in a memory cell subjected to reading in said read operation, and wherein said control circuit sets said memory cell subjected to writing in either a first state for erasing or an n-th state different from said first state when writing said binary data while setting said memory cell subjected to writing in any of n (at least three) different states in total ranging from said first state to said n-th state when writing said multivalued data.

2. The nonvolatile semiconductor memory device according to claim 1, wherein said control circuit determines to which one of states ranging from said first state to a k-th state, where said n is greater than said k, or ranging from a (k+1)-th state to said n-th state said memory cell storing said binary data belongs while determining to which one of said n states in total said memory cell storing said multivalued data belongs in said read operation.

3. The nonvolatile semiconductor memory device according to claim 2, wherein said control circuit determines to which one of said n states in total said memory cell storing said binary data belongs in said read operation and outputs a warning signal indicating change of said binary data when determining that said memory cell belongs to a state different from said first state or said n-th state.

4. The nonvolatile semiconductor memory device according to claim 2, wherein said control circuit determines to which one of said n states in total said memory cell storing said binary data belongs in said read operation and performs a write operation for rewriting said binary data in said memory cell when determining that said memory cell belongs to a state different from said first state or said n-th state.

5. A nonvolatile semiconductor memory device comprising:

a nonvolatile memory cell array including a plurality of memory cells; and a control circuit for controlling a write operation, a read operation and an erase operation for said plurality of memory cells, wherein said control circuit writes binary data or multivalued data in a memory cell subjected to writing in response to a write request and reads said binary data or said multivalued data in response to contents written in a memory cell subjected to reading in said read operation, and wherein said plurality of memory cells are divided into a plurality of write/read units collectively subjected to said write operation and said read operation, said nonvolatile semiconductor memory device further comprises a plurality of flags arranged for said plurality of write/read units respectively, and each of said plurality of flags stores a value indicating whether said binary data is written or said multivalued data is written in said memory cell of corresponding said write/read unit.

6. The nonvolatile semiconductor memory device according to claim 5, wherein said control circuit writes said binary data or said multivalued data in a corresponding write/read unit subjected to writing while writing a value indicating whether said binary data is written or said multivalued data is written in a corresponding flag in said write operation.

7. The nonvolatile semiconductor memory device according to claim 5, wherein said control circuit executes a first write sequence for writing said binary data or a second write sequence for writing said multivalued data for a corresponding write/read unit subjected to writing in response to externally received said write request.

8. The nonvolatile semiconductor memory device according to claim 5, wherein said control circuit executes a first read sequence for reading said binary data when said binary data is written in a corresponding write/read unit subjected to reading while executing a second read sequence for reading said multivalued data when said multivalued data is written in said corresponding write/read unit subjected to reading on the basis of the value of a corresponding flag in said read operation.

9. The nonvolatile semiconductor memory device according to claim 5, wherein each of said plurality of flags is identical in structure to the memory cell.

10. A nonvolatile semiconductor memory device comprising:
- a nonvolatile memory cell array including a plurality of memory cells; and
- a control circuit for controlling a write operation, a read operation and an erase operation for said plurality of memory cells, wherein
- said control circuit writes binary data or multivalued data in a memory cell subjected to writing in response to a write request and reads said binary data or said multivalued data in response to contents written in a memory cell subjected to reading in said read operation, and wherein
- each of said plurality of memory cells has different n states in total, where said n is at least three, including a first state for erasing and a second state closest to said first state, and
- said control circuit sets said memory cell subjected to writing in said first state or said second state when writing said binary data and determines whether said memory cell subjected to reading belongs to said first state or to any of said n states in total excluding said first state when reading said binary data.

11. A data storage system comprising:
- a memory area including a first nonvolatile semiconductor memory having a first characteristic and a second nonvolatile semiconductor memory having a second characteristic different from said first characteristic; and
- a control unit transmitting/receiving data to/from an external device for writing data in said memory area and reading data from said memory area, wherein
- said control unit determines whether writing matching with said first characteristic is required or writing matching with said second characteristic is required in response to storage data received from said external device to be written in said memory area and writes said storage data in said first nonvolatile semiconductor memory or said second nonvolatile semiconductor memory in response to said determination.

12. The data storage system according to claim 11, wherein
- said first characteristic is a characteristic capable of storing data with prescribed reliability and operating at a prescribed processing speed, and
- said second characteristic is a characteristic capable of storing data with higher reliability than said first characteristic and operating at a higher speed than said first characteristic.

13. The data storage system according to claim 12, wherein
- said first nonvolatile semiconductor memory includes a plurality of multivalued data memory cells each storing data of at least two bits, and
- said second nonvolatile semiconductor memory includes a plurality of memory cells each storing data of one bit.

14. The data storage system according to claim 12, wherein
- said control unit writes said storage data in said second nonvolatile semiconductor memory when determining that said external device requires an operation of writing data requiring relatively high reliability or transmitting/receiving data at a high speed while otherwise writing said storage data in said first nonvolatile semiconductor memory in response to said storage data.

15. The data storage system according to claim 12, wherein
- said control unit writes said storage data in said first nonvolatile semiconductor memory when said first nonvolatile semiconductor memory is not busy and writes said storage data in said second nonvolatile semiconductor memory when said first nonvolatile semiconductor memory is busy.

16. The data storage system according to claim 12, wherein
- said control unit transfers data already written in said second nonvolatile semiconductor memory to said first nonvolatile semiconductor memory in response to absence of data transmission/receiving to/from said external device.

17. The data storage system according to claim 12, wherein said control unit includes:
- a measuring circuit measuring the magnitude of said storage data received from said external device in a constant period, and
- a circuit receiving output of said measuring circuit and making control for writing said storage data in said first nonvolatile semiconductor memory when the magnitude of said storage data is not more than a reference value while writing said storage data in said second nonvolatile semiconductor memory when the magnitude of said storage data exceeds said reference value.

* * * * *